United States Patent
Dadashev et al.

(10) Patent No.: US 11,405,026 B2
(45) Date of Patent: Aug. 2, 2022

(54) METHOD AND CIRCUIT FOR ELECTROMAGNETIC INTERFERENCE (EMI) REDUCTION OF ANALOG BLOCKS

(71) Applicant: Infineon Technolgies LLC, San Jose, CA (US)

(72) Inventors: Oleg Dadashev, Hadera (IL); Yoram Betser, Mazkeret Batya (IL)

(73) Assignee: Infineon Technologies LLC, San Jose, CA (US)

( * ) Notice: Subject to any disclaimer, the term of this patent is extended or adjusted under 35 U.S.C. 154(b) by 0 days.

(21) Appl. No.: 17/161,763

(22) Filed: Jan. 29, 2021

(65) Prior Publication Data

US 2022/0052677 A1 Feb. 17, 2022

Related U.S. Application Data

(60) Provisional application No. 63/064,634, filed on Aug. 12, 2020.

(51) Int. Cl.
*H03K 5/1252* (2006.01)
*G06F 1/08* (2006.01)
(Continued)

(52) U.S. Cl.
CPC .............. *H03K 5/1252* (2013.01); *G06F 1/08* (2013.01); *H03K 5/00006* (2013.01); *H03K 19/21* (2013.01)

(58) Field of Classification Search
CPC .. H03K 5/1252; H03K 5/00006; H03K 19/21; H03K 3/0315; H03K 7/08; H03K 3/0231; G06F 1/06; G06F 1/08; G06F 1/10; G06F 1/12; H04B 15/04; H04B 15/06; H04B 15/02; H04B 2215/067; H02M 1/44; H02M 3/158; H03L 7/16; H03L 7/0895; H03L 7/099; H03L 7/087; H03L 7/18; H03L 7/07; H03L 7/0995; H03L 7/0805; H03L 7/093; H03L 7/7091; H03L 7/08; H03L 7/0891; H03L 7/06

See application file for complete search history.

(56) References Cited

U.S. PATENT DOCUMENTS

2004/0001600 A1  1/2004 Kim et al.
2004/0136440 A1* 7/2004 Miyata ................. H03L 7/0895
                                              375/130

(Continued)

OTHER PUBLICATIONS

International Search Report for International Application No. PCT/US21/45692, dated Nov. 16, 2021; 3 pages.

(Continued)

*Primary Examiner* — John W Poos

(57) ABSTRACT

Embodiments of the present disclosure provide systems and methods of reducing the EMI effect generated by such analog blocks. By varying the clock frequency in time of oscillators used by such analog blocks, the EMI energy may be spread over a wide spectrum range thereby reducing the peak energy for the main frequency. To achieve this, the oscillator frequency is directly varied using analog mechanisms. The mechanisms may be based on a synchronized method for increasing/decreasing the current that is charging/discharging the oscillator capacitor. The frequency variation may be achieved by analog control of the extra charge/discharge current.

24 Claims, 19 Drawing Sheets

(51) Int. Cl.
    *H03K 5/00*        (2006.01)
    *H03K 19/21*      (2006.01)

(56) References Cited

U.S. PATENT DOCUMENTS

| | | | |
|---|---|---|---|
| 2006/0098714 A1 | 5/2006 | Shin et al. | |
| 2008/0063130 A1 | 3/2008 | Chen | |
| 2010/0246219 A1* | 9/2010 | Ying | H02M 1/44 |
| | | | 363/74 |
| 2011/0085359 A1* | 4/2011 | Gong | H02M 3/33507 |
| | | | 363/21.18 |
| 2015/0061625 A1* | 3/2015 | Chen | H02M 1/44 |
| | | | 323/282 |
| 2017/0141782 A1* | 5/2017 | Todorokihara | H03L 7/16 |
| 2021/0273562 A1* | 9/2021 | Ozalevli | H02M 3/158 |

OTHER PUBLICATIONS

Written Opinion of the International Searching Authority for International Application No. PCT/US21/45692, dated Nov. 16, 2021; 5 pages.

\* cited by examiner

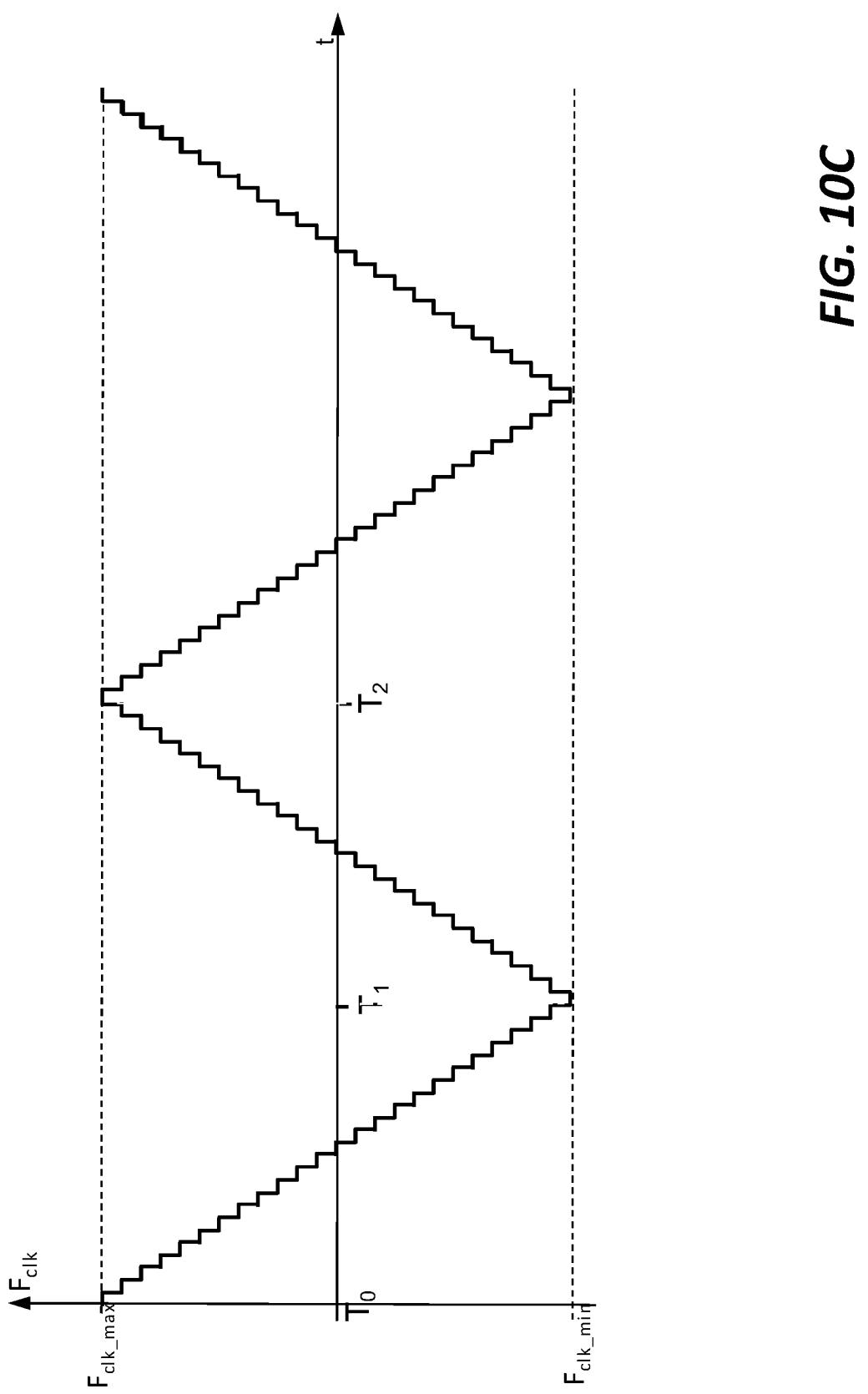

METHOD AND CIRCUIT FOR ELECTROMAGNETIC INTERFERENCE (EMI) REDUCTION OF ANALOG BLOCKS

RELATED APPLICATIONS

This application claims priority to U.S. Provisional Patent Application No. 63/064,634, filed on Aug. 12, 2020, the disclosure of which is hereby incorporated herein in its entirety.

TECHNICAL FIELD

The present disclosure relates generally to analog circuit blocks such as charge pumps, and more particularly to mitigation of electromagnetic interference (EMI) generated by such analog circuit blocks.

BACKGROUND

Many systems include an internal clock generator to generate a clock signal for various electronic devices in the system. The internal clock generator can include a fixed-frequency oscillator to generate the clock signal with a specific frequency. While clock signals with a specific frequency can drive and/or provide timing for the various electronic devices in the system, a device or a system including the fixed-frequency oscillator can emit radio frequency (RF) signals of sufficient magnitude that can cause electromagnetic interference (EMI) that affects surrounding electronic devices operating near the specific frequency or harmonics of the EMI.

BRIEF DESCRIPTION OF THE DRAWINGS

The present embodiments are illustrated by way of example, and not of limitation, in the figures of the accompanying drawings.

FIG. 10C is a diagram illustrating the frequency of the clock signal output by the oscillator of FIG. 10A over time, according to some embodiments of the present disclosure.

DETAILED DESCRIPTION

Figure 1:
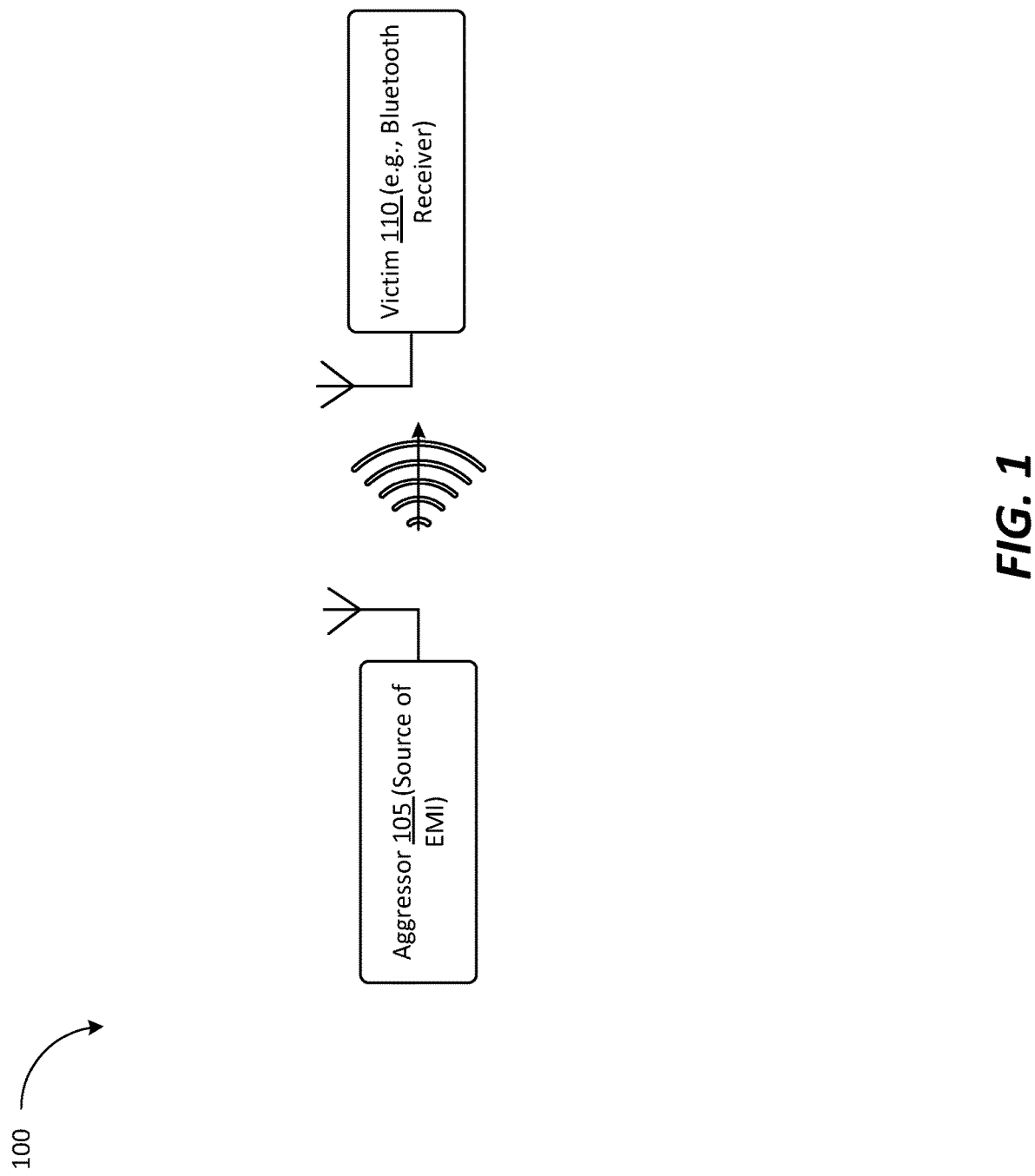
FIG. 1 is a block diagram illustrating an aggressor device which is generating EMI that interferes with another (victim) device, according to some embodiments of the present disclosure.

In the following description, for purposes of explanation, numerous specific details are set forth in order to provide a thorough understanding of the present embodiments. It will be evident, however, to one skilled in the art that the present embodiments may be practiced without these specific details. In other instances, well-known circuits, structures, and techniques are not shown in detail, but rather in a block diagram in order to avoid unnecessarily obscuring an understanding of this description.

Reference in the description to "one embodiment" or "an embodiment" means that a particular feature, structure, or characteristic described in connection with the embodiment is included in at least one embodiment. The phrase "in one embodiment" located in various places in this description does not necessarily refer to the same embodiment.

High power analog blocks, such as high-voltage (HV) Charge-Pumps (CP's) for example, can create large current and voltage variations on the power supplies. These variations are synchronized to a certain frequency when an oscillator is used in the analog design of the CP to provide a clock signal. On every positive and/or negative edge of the clock signal, the CP provides a boost of current to the system in a synchronous way. Observing the frequency components of the CP's output current waveform, it can be seen that the variations have a very narrow and high current peak at a specific frequency—typically 2 times the clock frequency because the operation is done on both edges of the clock. This causes an Electro-Magnetic Interference (EMI) that can harm sensitive circuits such as Bluetooth transmitters, that are placed closed to the noisy circuitry.

Embodiments of the present disclosure provide systems, apparatus, and methods of reducing the EMI effect generated by such analog blocks. By varying the clock frequency in time of oscillators used by such analog blocks, the EMI energy may be spread over a wide spectrum range thereby reducing the peak energy for the main frequency. To achieve this, the oscillator frequency is directly varied using analog mechanisms. The mechanisms may be based on a synchronized method for increasing/decreasing the current that is charging/discharging the oscillator capacitor. The frequency variation may be achieved by analog control of the extra charge/discharge current.

For example, described herein is a system for reducing the EMI effect generated by analog blocks comprising: an oscillator configured to generate a clock signal and a frequency modulator operatively coupled to the oscillator. The frequency modulator is configured to generate a modulator clock signal based on the clock signal generated by the oscillator and alternately provide a charge current and a discharge current to a node of the oscillator during charging and discharging stages of the node based on the modulator clock signal and when the modulator clock signal is in phase with the clock signal to increase a frequency of the clock signal, wherein the modulator clock signal has a first frequency. The frequency modulator is further configured to alternately provide the charge current and the discharge current to the node of the oscillator during charging and discharging stages of the node based on the modulator clock signal and when the modulator clock signal is not in phase with the clock signal to decrease the frequency of the clock signal, thereby varying the frequency of the clock signal around a nominal frequency based on the modulator clock signal.

FIG. 1 is a block diagram illustrating an aggressor device 105 which may be any appropriate high power analog block such as a high voltage charge pump, and a victim device 110 which may be any device with sensitive circuitry such as a Bluetooth receiver. As discussed above, the aggressor device 105 may create large current and voltage variations which are synchronized to a certain frequency when the aggressor device 105 comprises an oscillator to provide a clock signal. On every positive and negative edge, the CP provides a boost of current to the system in a synchronous way. The variations have a narrow and high current peak at a specific frequency which causes EMI that can harm the victim device 110, which may be any device with sensitive circuitry, such as Bluetooth transmitters, and which are placed closed to the aggressor device 105.

Figure 2:
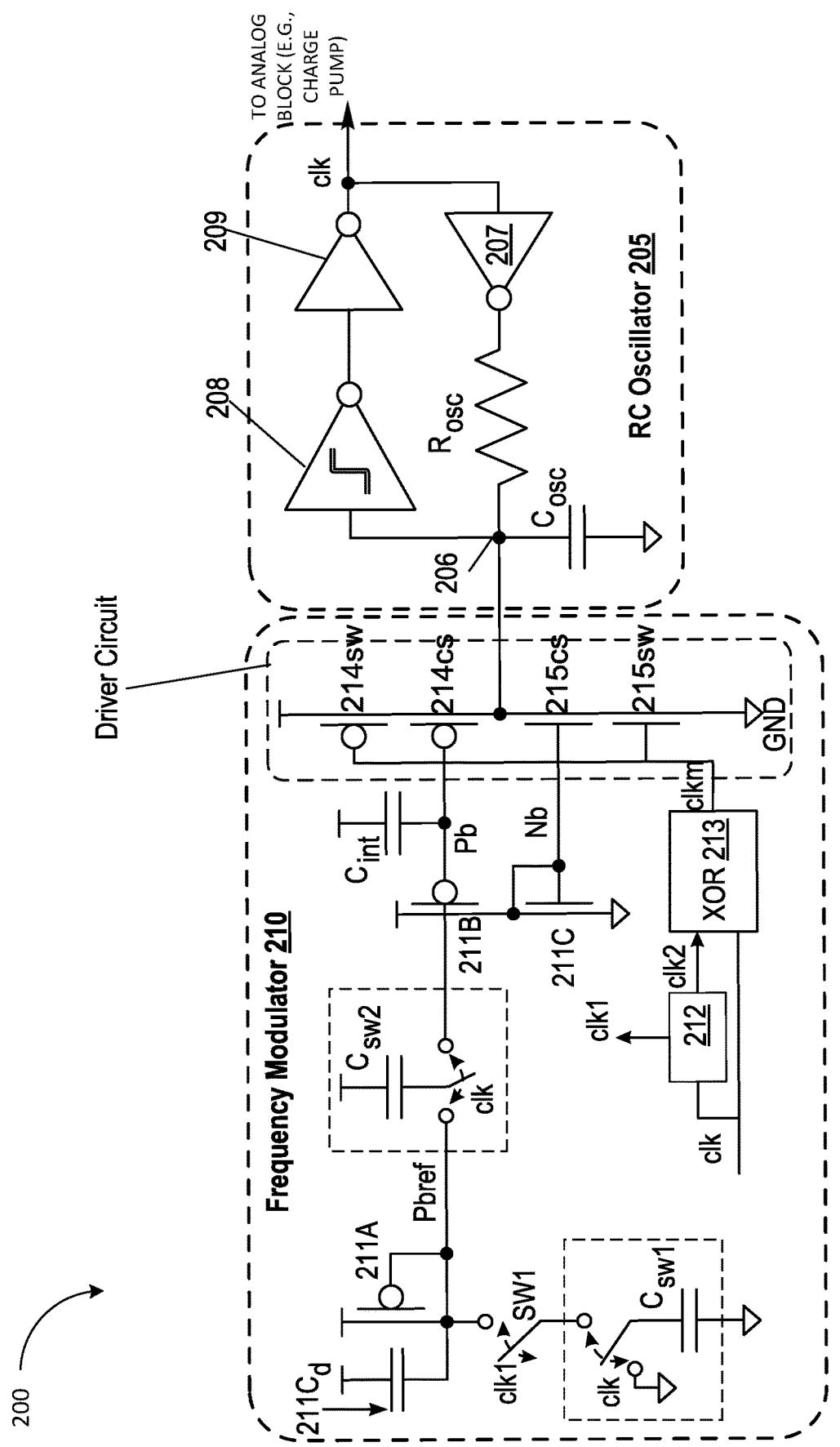
FIG. 2 is a block diagram illustrating a system including a frequency modulator and an oscillator, according to some embodiments of the present disclosure.

FIG. 2 illustrates a system 200 including an RC oscillator 205 and a frequency modulator 210 (hereinafter referred to as "modulator 210"), in accordance with some embodiments of the present disclosure. The RC oscillator 205 may comprise inverters 207, 208 and 209, as well as a resistor Rosc and a capacitor Cosc. The RC oscillator 205 may generate and provide a clock signal (clk) to any appropriate analog block (e.g., a charge pump) as described herein. The modulator 210 may comprise switch capacitors Csw1 and Csw2, a transistor 211A connected to a node Pbref, a charge capacitor 211 Cd, and a switch SW1 (also referred to herein as a switching circuit) to selectively couple switch capacitor Csw1 to transistor 211A. Modulator 210 may utilize switch capacitor Csw1 to charge the node Pbref (e.g., to a high state) through the transistor 211A which may be any appropriate transistor such as a PMOS transistor, or discharge node Pbref (e.g., to a low state). Modulator 210 may further comprise transistors 211B and 211C, which are coupled to the nodes Pb and Nb respectively. The modulator 210 may subsequently use switch capacitor Csw2 to charge/discharge the transistors 211B and 211C based on the charging/discharging of node Pbref as can be seen in FIG. 2. The modulator 210 may further comprise transistors 214cs and 215cs which may act as current sources, a frequency divider 212, an XOR device 213, and transistors 214sw and 215sw (which may act as switches). Transistors 211B and 211C may be PMOS and NMOS transistors respectively. Transistors 214cs and 214sw may be PMOS transistors while transistors 215cs and 215sw may be NMOS transistors. Modulator 210 may realize the transistors 214cs and 215cs as current sources. With this, the node Pbref slowly charges or discharges, which in turn slowly varies the nodes Pb and Nb, which directly varies the charge/discharge currents from transistors 214cs and 215cs respectively as discussed in further detail herein. In this way, the modulator 210 may provide an additional current to the RC node 206 of the RC oscillator 205 to vary the charging/discharging of the oscillator capacitor Cosc (where otherwise the RC oscillator 205 attempts to drive the same current through the RC node 206 through resistor Rosc at all times) and thereby vary the frequency of clk ($F_{clk}$) around its nominal value ($F_{clk0}$) as discussed in further detail herein. In this way, the EMI generated by an analog block that RC oscillator 205 is a part of may be spread over multiple frequencies. This additional current is supplied by current sources 214cs and 215cs and is synchronized to the RC node 206's (oscillator 205's) charge/discharge phases using the switches 214sw and 215sw as discussed in further detail herein.

Figure 3A:
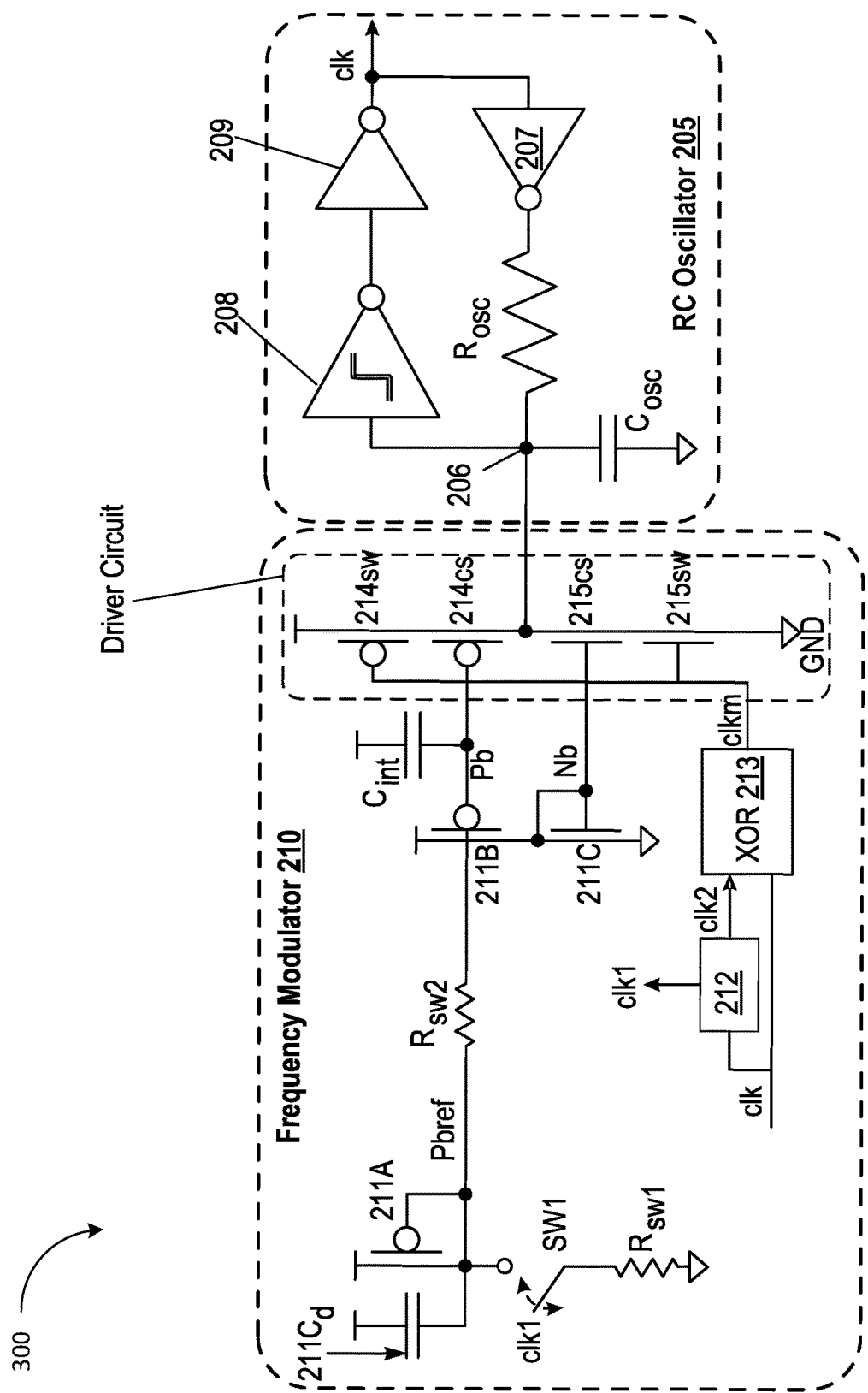
FIG. 3A is a block diagram illustrating a system including a frequency modulator and an oscillator, according to some embodiments of the present disclosure.
Figure 4:
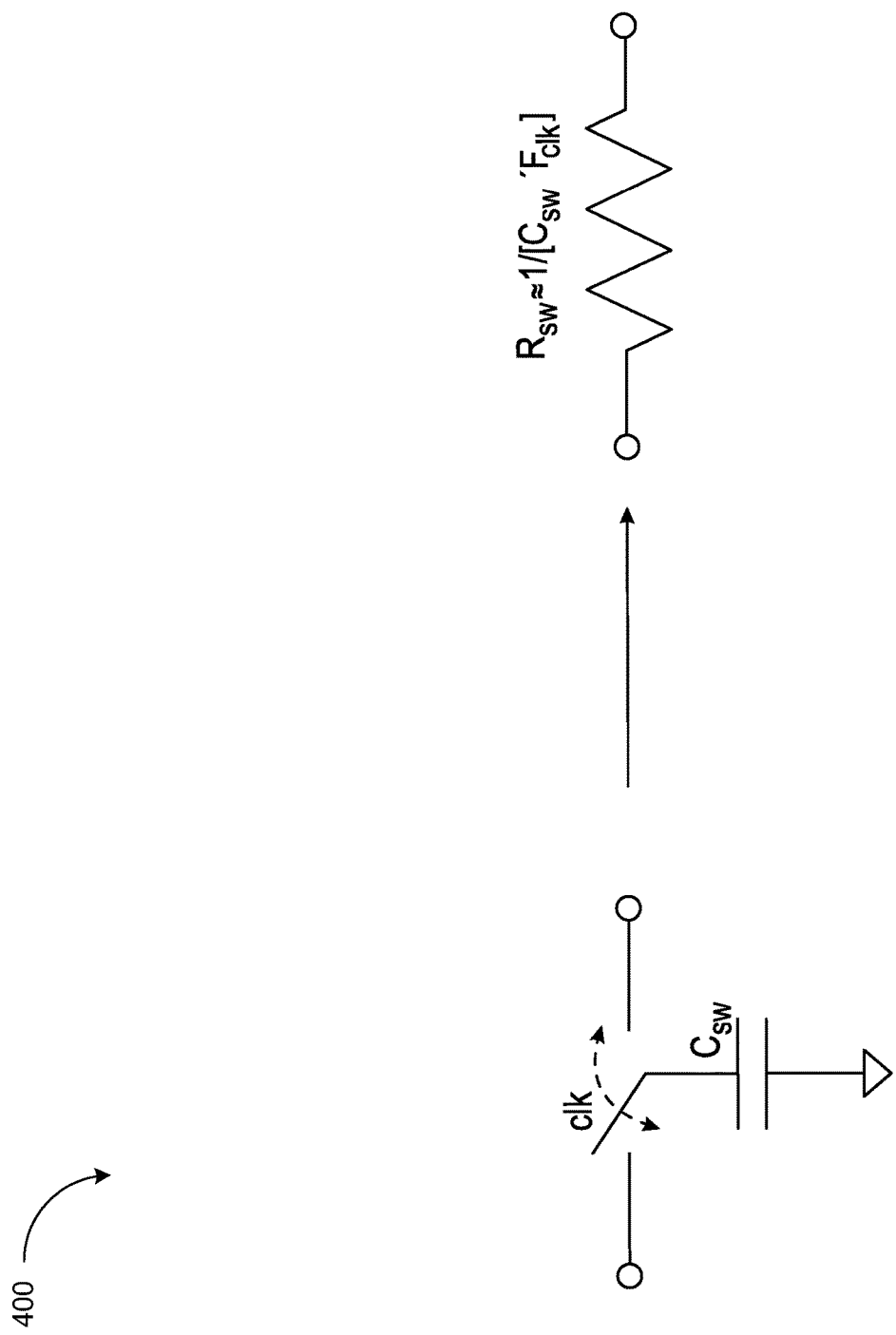
FIG. 4 is a diagram illustrating an equivalent resistance of a switch capacitor, according to some embodiments of the present disclosure.

In order to effectively spread EMI over multiple frequencies, the node Pb must be charged and discharged slowly over time, and thus the additional current provided by the modulator 210 must be varied slowly over time. Because the time constant for charging/discharging is a function of the resistance and the capacitance ($\tau=R_{sw2} \times C_{int}$), in order to achieve e.g., very low frequencies (e.g., in the kilohertz range), a very large resistance is required to increase the time over which the additional current will be added (i.e. increase the time over which $F_{clk}$ will vary). FIG. 3A illustrates the system 300 which is similar to the system 200 except the switch capacitors Csw1 and Csw2 of modulator 210 are replaced with large equivalent resistances (Rsw1 and Rsw2 respectively) that model the voltage-current relationship of the switch capacitors e.g., Csw: $R_{eq} \approx 1/[C_{sw} \times F_{clk}]$. This achieves a large equivalent resistance in an efficient way and allows the modulator 210 to charge and discharge the RC node 206 slowly. FIG. 4 illustrates an equivalent resistance Rsw for a switch capacitor Csw of FIG. 2. Using an equivalent resistance scheme as discussed herein enables achieving an area efficient solution for realizing the large time constant ($\tau=R_{sw2} \times C_{int}$) required for the slow variation of the charging/discharging additional current to be provided by modulator 210.

Referring back to FIG. 3A, when the clk is 1 ("high"), the RC node 206 of the RC oscillator 205 is discharged because the inverter 207 provides a 0 ("low") voltage signal to Rosc. When the clk is 0, current is provided to the RC node 206 via Rosc because the inverter 207 changes the 0 clk value to 1, and thus provides a high voltage signal to Rosc. Thus, for every cycle of clk, the node RC is charged during one half of the cycle of clk and discharged during the other half of the cycle of clk.

Figure 5:
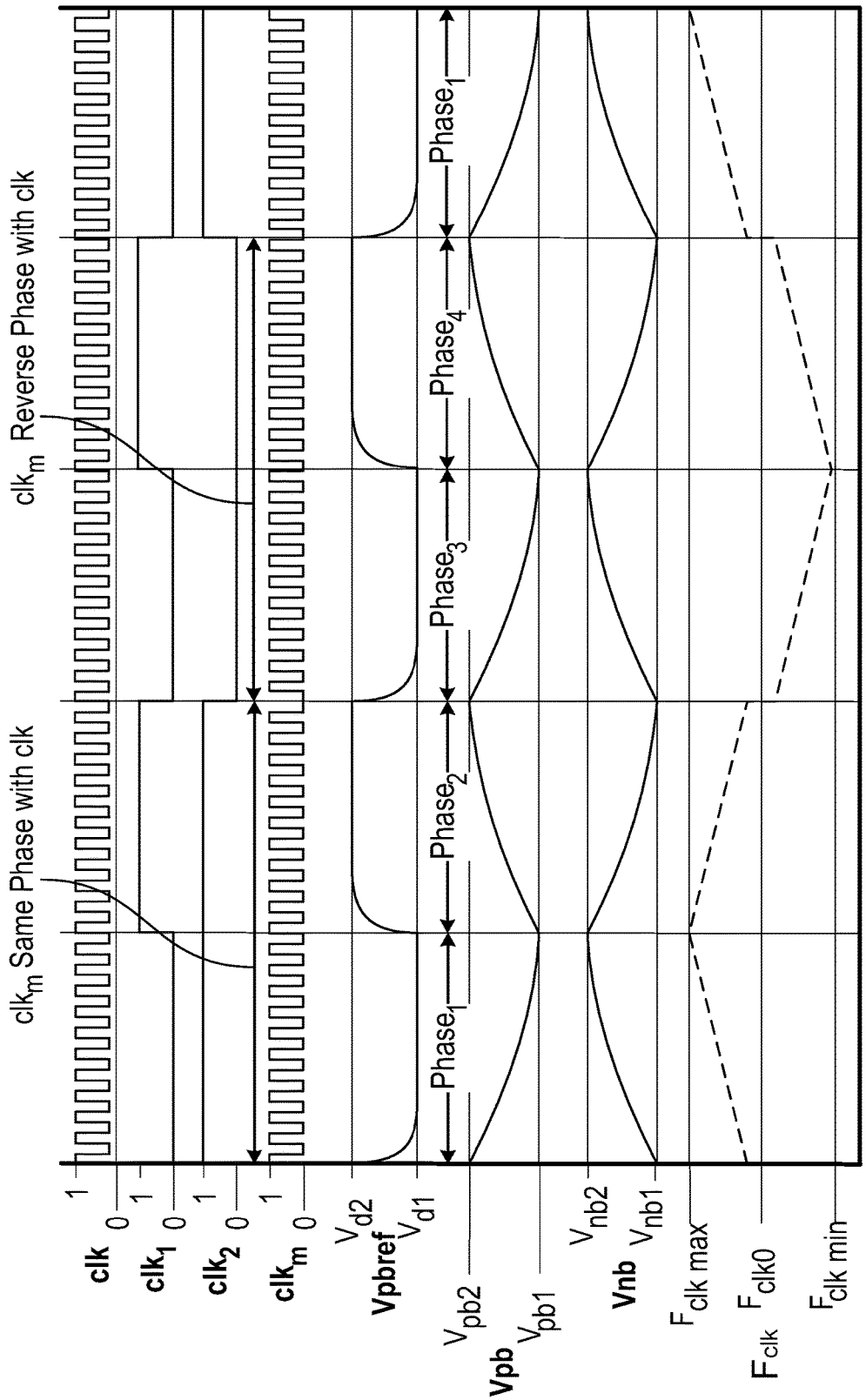
FIG. 5 illustrates a timing diagram for the frequency modulator of FIG. 3, according to some embodiments of the present disclosure.

RC oscillator 205 may output the clock signal clk to the modulator 210 in order to synchronize the clock signal clk. The modulator 210 may input the clock signal clk to a frequency divider 212 which may generate clock signals clk1 and clk 2, both of which may alternate between 0 and 1 values at a lower frequency than clk (as shown in FIG. 5). The modulator 210 may input clk1 to switch SW1 and use it to operate switch SW1. When clk1 is "1," SW1 is turned off and the node Pbref is charged high through the transistor 211A. When clk1 is "0" SW1 is turned on which leads to a discharging of the node Pbref low through Rsw1. The modulator 210 may also input clk along with clk2 to XOR 213 which may generate the clock signal clkm, which may transition between 0 and 1 values at the same frequency as clk and is alternately in phase and out of phase with clk based on clk2. When clk2 is 1, the output of XOR 213 (clkm) may be in phase with clk and when clk2 is 0, clkm may be out of phase with clk. For example, when clk and clkm are in phase, clkm may transition between 1 and 0 values at the same frequency and phase as clk and when clk and clkm are not in phase, clkm may transition between 1 and 0 values at the same frequency but opposite phase as clk. Because clkm is based on clk, when clkm is 1 or 0, this may represent a stable time (charging/discharging of RC node 206) during which the frequency of clk may be varied. The modulator 210 may vary the frequency of clk around its nominal value ($F_{clk0}$) by providing an additional current to the RC node 206 to charge/discharge the oscillator capacitor $C_{osc}$. This additional current is supplied by transistors 214cs and 215cs (current sources) of the modulator 210, which are synchronized to the RC node 206's (i.e. oscillator 205's) charge and discharge phases respectively using the switches 214sw and 215sw respectively as the modulator 210 operates them using clkm. Stated differently, 214cs may assist in charging the RC node 206 and 215cs may assist in discharging the RC node 206. When the current sources 214cs and 215cs charge/discharge the RC node 206 with the same phase as clk, the sum charge/discharge current is greater than the nominal current and therefore $F_{clk} > F_{clk0}$. When 214cs and 215cs charge/discharge the RC node in an opposite phase to clk, the sum charge/discharge current is smaller than the nominal current and therefore $F_{clk} < F_{clk0}$. The values of the current provided by transistors 214cs and 215cs varies slowly with time (as discussed herein), which leads to a slow deviation of $F_{clk}$ around $F_{clk0}$ in order to achieve maximum energy spread in a wide frequency spectrum range. As discussed herein, modulator 210 may realize the transistors 214cs and 215cs as current sources by slowly charging the node Pbref via transistor 211A and discharging the node Pbref via Rsw1, which in turn slowly varies the nodes Pb and Nb. This in turn directly varies the charge/discharge currents of 214cs and 215cs.

The RC node 206 charges for half the cycle of clk and discharges for half the cycle of clk. To change frequency of clk (Fclk), the modulator 210 may drive additional current to the RC node 206 as discussed in further detail herein. For example, when RC node 206 is to charge, transistor 214sw will be on, and current will be driven through transistor 214cs.

When clk and clkm are in phase (e.g., clk2 is 1), modulator 210 may increase the frequency of clk by assisting with the charge and discharge of node RC. For example, when the clk is 1, the node RC is discharged because the inverter 207 provides a 0 or, low voltage signal to Rosc. During discharge, RC node 206 can either be charged or discharged by modulator 210 in order to vary the frequency of clk. In order to assist RC node 206 in discharging, more current must be pulled through to ground from RC node 206. Because clkm and clk are in-phase, clkm is also 1 and transistor 215sw is enabled and will discharge current from RC node 206 to ground via 215cs based on the discharge current of node Nb. This aids in the discharging of RC node 206 to ground (GND). Once clk changes to 0, clkm also changes to 0, and current is provided to the RC node 206 via Rosc because clk is 0, and thus the inverter 207 changes this to 1, providing a high voltage signal to Rosc. In addition, because clkm is also 0, transistor 214sw may be enabled, and allow transistor 214cs to charge RC node 206 with additional current based on the charge current of node Pb. While clk1 is 0, the discharge current of node Nb is increasing and so an increasing amount of discharge current is provided by the modulator 210 on each successive 1 ("high") state of clkm and a decreasing amount of charge current is provided by the modulator on each successive 0 ("low") state of clkm (see FIG. 5). Conversely, while clk1 is 1, the discharge current of node Nb is decreasing and so a decreasing amount of discharge current is provided by the modulator 210 on each successive 1 state of clkm and an increasing amount of charge current is provided by the modulator 210 on each successive 0 state of clkm (see FIG. 5).

Although the embodiments described above utilize both phases of clk to assist with both charging and discharging of RC node 206, in some alternative embodiments the modulator 210 may utilize only a single phase of clk e.g., modulator 210 may either assist with the charging or discharging of the RC node 206 in order to increase the frequency of clk.

When clk and clkm are not in phase (e.g., clk2 is 0), modulator 210 may decrease the frequency of clk by impeding the charge and discharge of RC node 206. For example, when the clk is 1, the RC node 206 is discharged because the inverter 207 provides a 0 or, "low voltage" signal to Rosc. At this time, clkm is 0, so 214cs and 214sw are enabled and will charge RC node 206 with additional current which interferes with the RC node 206's discharge, thereby decreasing the frequency of clk. When the clk is 0, the RC node 206 is charged because the inverter 207 provides a 1 or, "high voltage" signal to Rosc. At this time, clkm is 1, so 215cs and 215sw are enabled and will discharge RC node 206 which interferes with the RC node 206's charging, thereby decreasing the frequency of clk. While clk1 is 0, the discharge current of node Nb is increasing and so an increasing amount of discharge current is provided by the modulator 210 on each successive 1 ("high") state of clkm and a decreasing amount of charge current is provided by the modulator on each successive 0 ("low") state of clkm (see FIG. 5). Conversely, while clk1 is 1, the discharge current of node Nb is decreasing and so a decreasing amount of discharge current is provided by the modulator 210 on each successive 1 state of clkm and an increasing amount of charge current is provided by the modulator 210 on each successive 0 state of clkm (see FIG. 5).

Although the embodiments described above utilize both phases of clk to impede both the charging and discharging of RC node 206, in some alternative embodiments the modulator 210 may utilize only a single phase of clk e.g., modulator 210 may either impede the charging or discharging of the RC node 206 in order to decrease the frequency of clk.

FIG. 5 illustrates a timing diagram 500 for the frequency modulator 210 of FIGS. 2 and 3A. As can be seen in FIG.

5, in phase 1, $V_{Pbref}=V_{d1}$ and therefore $V_{pb}$ slowly drops from $V_{pb2}$ to $V_{pb1}$. As a result, the current of the modulator 210's driver circuit (comprising 214sw, 214cs, 215sw, and 215cs) slowly rises. Because clkm currently has the same phase as clk, the influence of the driver circuit current leads to an increase in the frequency $F_{clk}$ relative to the nominal $F_{clk0}$. Therefore, $F_{clk}$ gradually rises to maximum ($F_{clk\_max}$).

In phase 2, $V_{pbref}$ rises to $V_{d2}$ and thus $V_{pb}$ slowly rises from $V_{pb1}$ to $V_{pb2}$. Now we are discharging Nb instead of charging it and as a result, the current of the modulator 210's driver circuit slowly decreases. Because clkm currently has the same phase as clk, the influence of the driver circuit current leads to an increase in the frequency $F_{clk}$ relative to $F_{clk0}$. Therefore, $F_{clk}$ gradually decreases to the level equal to the frequency at the beginning of phase 1.

In phase 3, $V_{pbref}$ lowers to $V_{d1}$ and thus $V_{pb}$ slowly drops from $V_{pb2}$ to $V_{pb1}$. As a result, the current of the modulator 210's driver circuit slowly rises. Because clkm now has an opposite phase to clk, the influence of the driver circuit current leads to a decrease in the frequency $F_{clk}$ relative to the nominal $F_{clk0}$. Therefore, $F_{clk}$ gradually falls to minimum ($F_{clk\_min}$).

In phase 4, $V_{pbref}$ rises to $V_{d2}$ and thus $V_{pb}$ slowly rises from $V_{pb1}$ to $V_{pb2}$. As a result, the current of the modulator 210's driver circuit slowly decreases. Because clkm has the opposite phase to clk, the influence of the driver circuit current leads to a decrease in the frequency $F_{clk}$ relative to the nominal $F_{clk0}$. Therefore, $F_{clk}$ gradually increases to a level equal to the frequency at the beginning of phase 3.

Figure 6:
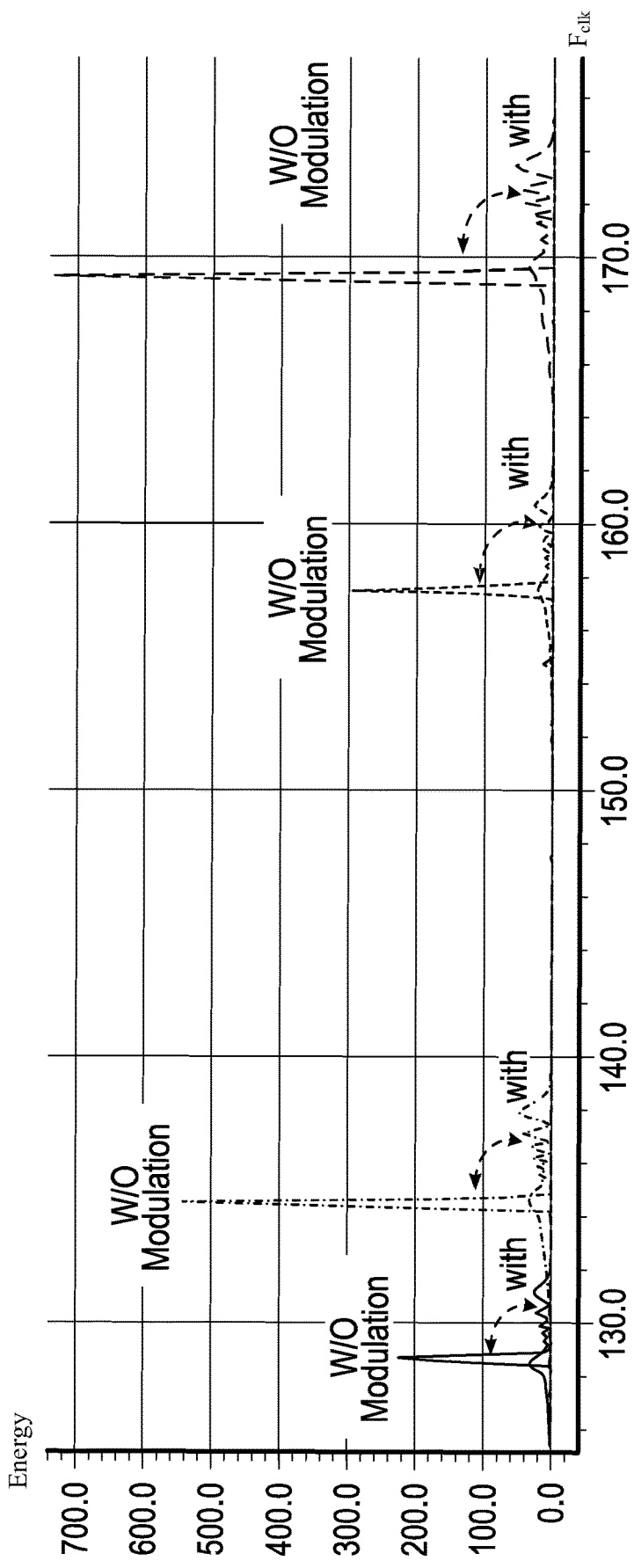
FIG. 6 is a diagram illustrating the spread of EMI energy over the frequency spectrum with and without the frequency modulation provided by the frequency modulator of FIGS. 2 and 3 for various operating voltage/temperature combinations, according to some embodiments of the present disclosure.

FIG. 6 is a graph 600 of the power spectral density of EMI interference with vs without the frequency modulation techniques discussed herein, for 4 different operating voltage/temperature combinations. As can be seen, for each operating voltage/temperature combination, the use of the frequency modulation techniques discussed herein reduces the peak energy for the main frequency by ~30 times and spreads it across a wider range of frequencies.

Figure 3B:
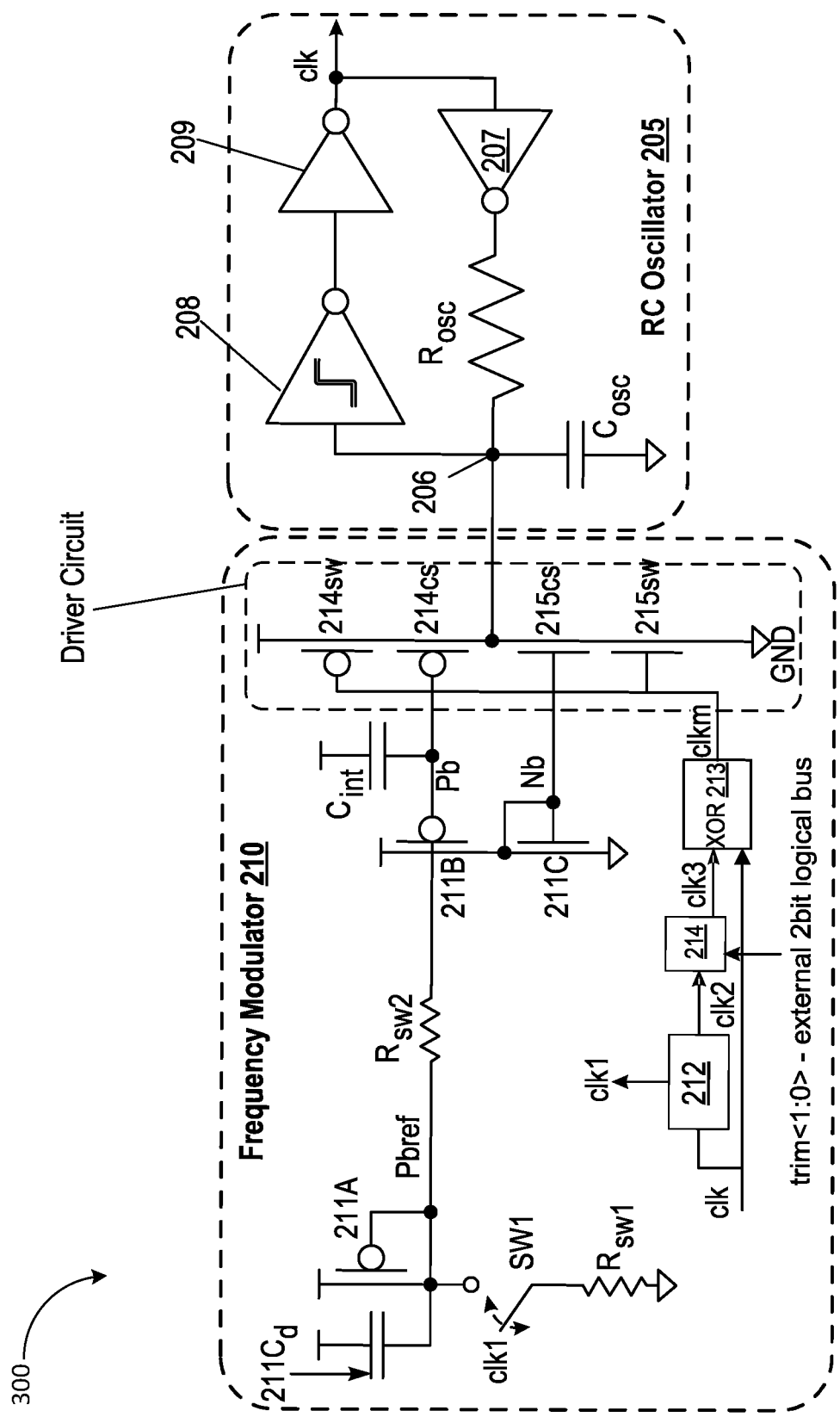
FIG. 3B is a block diagram illustrating a system including a frequency modulator and an oscillator, according to some embodiments of the present disclosure.

Although the embodiments described above operate when clk and clkm are in phase and out of phase with each other, in some embodiments the modulator 210 may only operate when clk and clkm are in phase with each other or only operate when clk and clkm are out of phase with each other. For example, referring to FIG. 5, the system 200 may go from phase1->phase2->phase 1->phase2 (i.e. alternate between phase 1 and phase 2) instead of transitioning to phase 3 and phase 4. This may reduce any frequency discontinuity between phase 2 and phase 3. FIG. 3B illustrates the system 300 in accordance with some embodiments of the present disclosure, wherein the frequency modulator 210 includes a logical block 214, which may be an external 2 bit logical bus which can provide trimming for clk2 (trim <1:0>). The output of the logical block 214 may be a clock signal clk3 which is: equal to clk2, when trim <1:0>=00; equal to "0," when trim <1:0>=01; equal to "1," when trim <1:0>=10 or 11. In this way, the frequency modulator 210 may transition from phase 1 to phase 2

Figure 7:
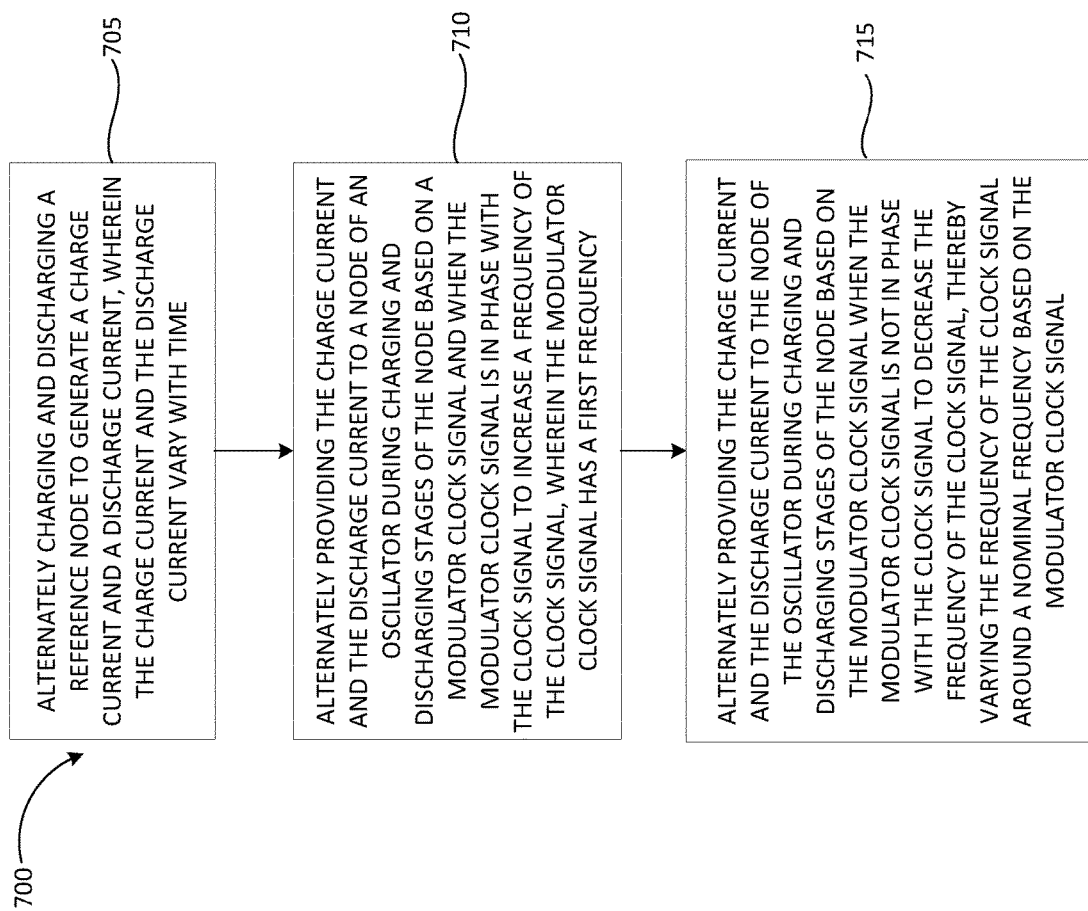
FIG. 7 is a flow diagram of a method for spreading EMI energy over the frequency spectrum using the frequency modulator of FIGS. 2 and 3, in accordance with some embodiments of the present disclosure.

FIG. 7 is a flow diagram of a method 700 of spreading EMI interference over multiple frequencies in the frequency spectrum, in accordance with some embodiments of the present disclosure. Method 700 may be performed by processing logic that may comprise hardware (e.g., circuitry, dedicated logic, programmable logic, a processor, a processing device, a central processing unit (CPU), a system-on-chip (SoC), etc.), software (e.g., instructions running/executing on a processing device), firmware (e.g., microcode), or a combination thereof. For example, the method 700 may be performed by the modulator 210 of FIGS. 2 and 3.

Referring also to FIG. 3A, at block 705, the frequency modulator 210 may alternately charge and discharge a node pbref to generate a charge current and a discharge current at nodes Pb and Nb respectively, wherein the charge current and the discharge current vary with time. An RC oscillator 205 may generate a clock signal which may be output to any appropriate analog block, such as a high voltage charge pump. The RC oscillator 205 may also provide the clock signal to the frequency modulator 210. At block 710, the frequency modulator 210 may alternately provide the charge current and the discharge current to an RC node 206 of RC oscillator 205 via transistors 214cs and 215cs during charging and discharging stages of the RC node 206 based on a modulator clock signal and when the modulator clock signal is in phase with the clock signal to increase a frequency of the clock signal, wherein the modulator clock signal is based on the clock signal and has a first frequency that is equal to the frequency of the clock signal. At block 715, the frequency modulator 210 may alternately provide the charge current and the discharge current to the RC node 206 of the RC oscillator 205 via transistors 214cs and 215cs during charging and discharging stages of the RC node 206 based on the modulator clock signal when the modulator clock signal is not in phase with the clock signal to decrease the frequency of the clock signal, thereby varying the frequency of the clock signal around a nominal frequency based on the modulator clock signal.

Figure 8A:
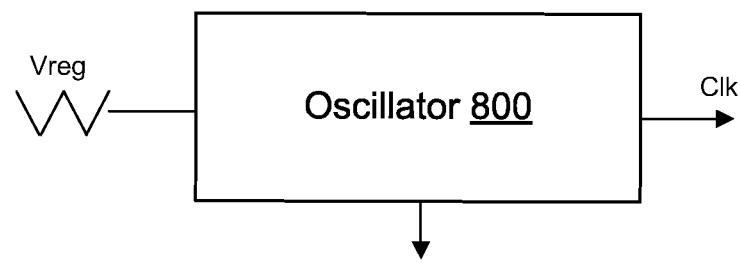
FIG. 8A is a block diagram illustrating an oscillator, according to some embodiments of the present disclosure.
Figure 8B:
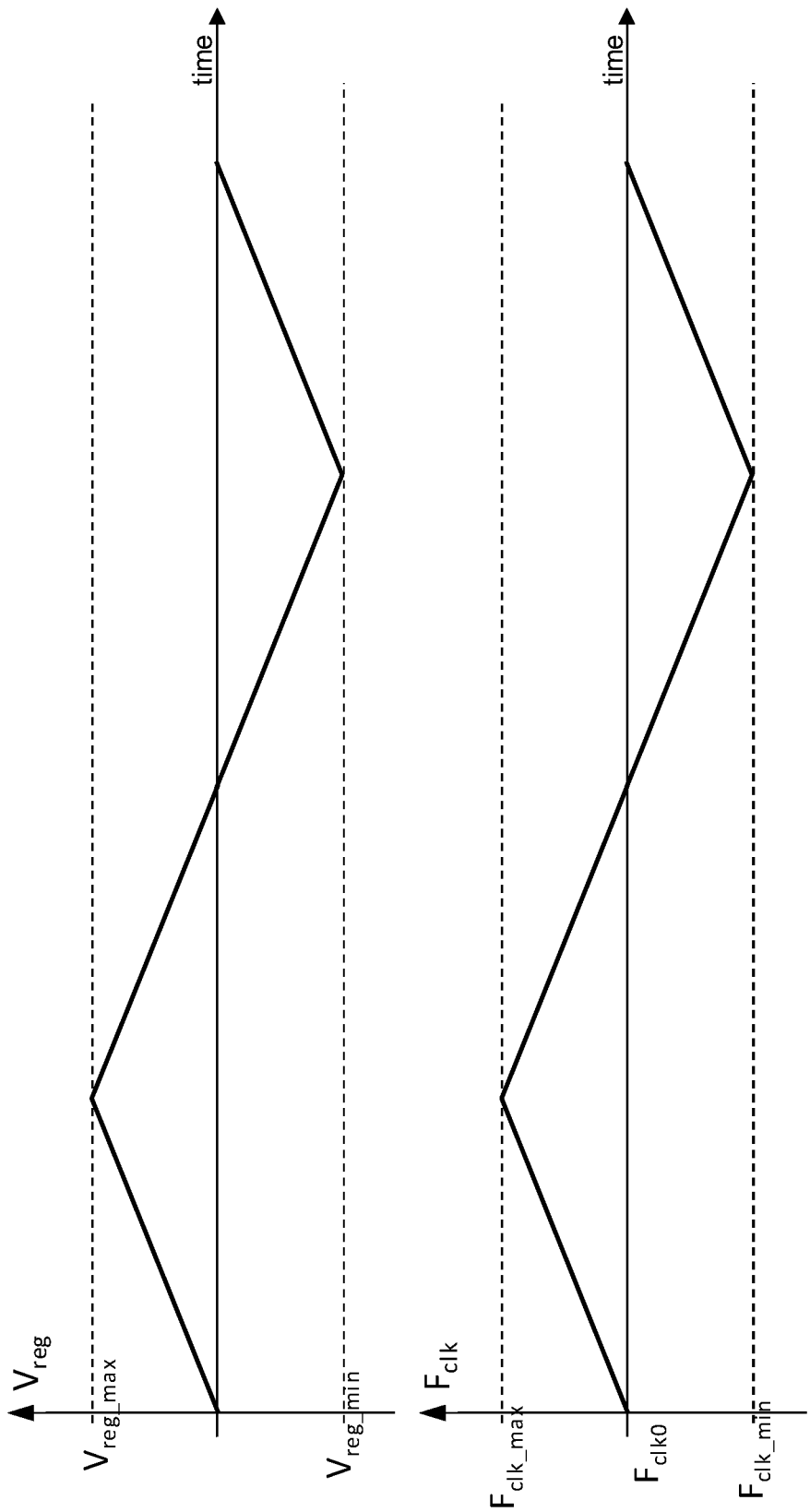
FIG. 8B is a diagram illustrating the relationship between input voltage to an oscillator and the frequency of the clock signal output by the oscillator over time, according to some embodiments of the present disclosure.

FIG. 8A illustrates an oscillator 800 in accordance with some embodiments of the present disclosure. The oscillator 800 may be any appropriate oscillator (such as the RC oscillator 205 illustrated in FIG. 2) whose output clock signal (clk) frequency (Fclk) is based at least in part on the input voltage (Vreg) value. The Vreg may be any appropriate input voltage to one or more elements of the oscillator 800, such as a supply voltage, a control voltage (e.g., where oscillator 800 is a voltage controlled oscillator), or any other voltage which may influence Fclk. The periodic slow variation of Vreg may result in a modulation of the Fclk, as shown in FIG. 8B (waveform is an example only).

Figure 8C:
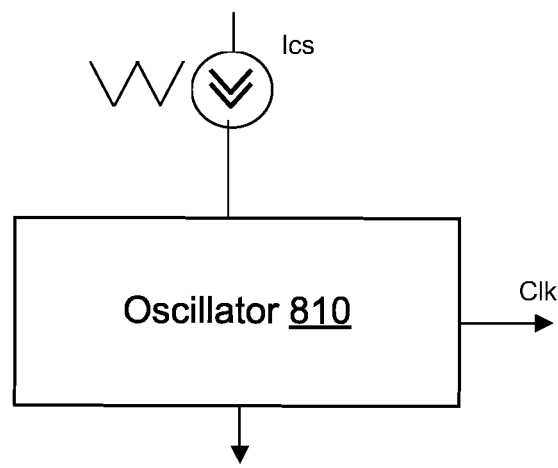
FIG. 8C is a block diagram illustrating an oscillator, according to some embodiments of the present disclosure.
Figure 8D:
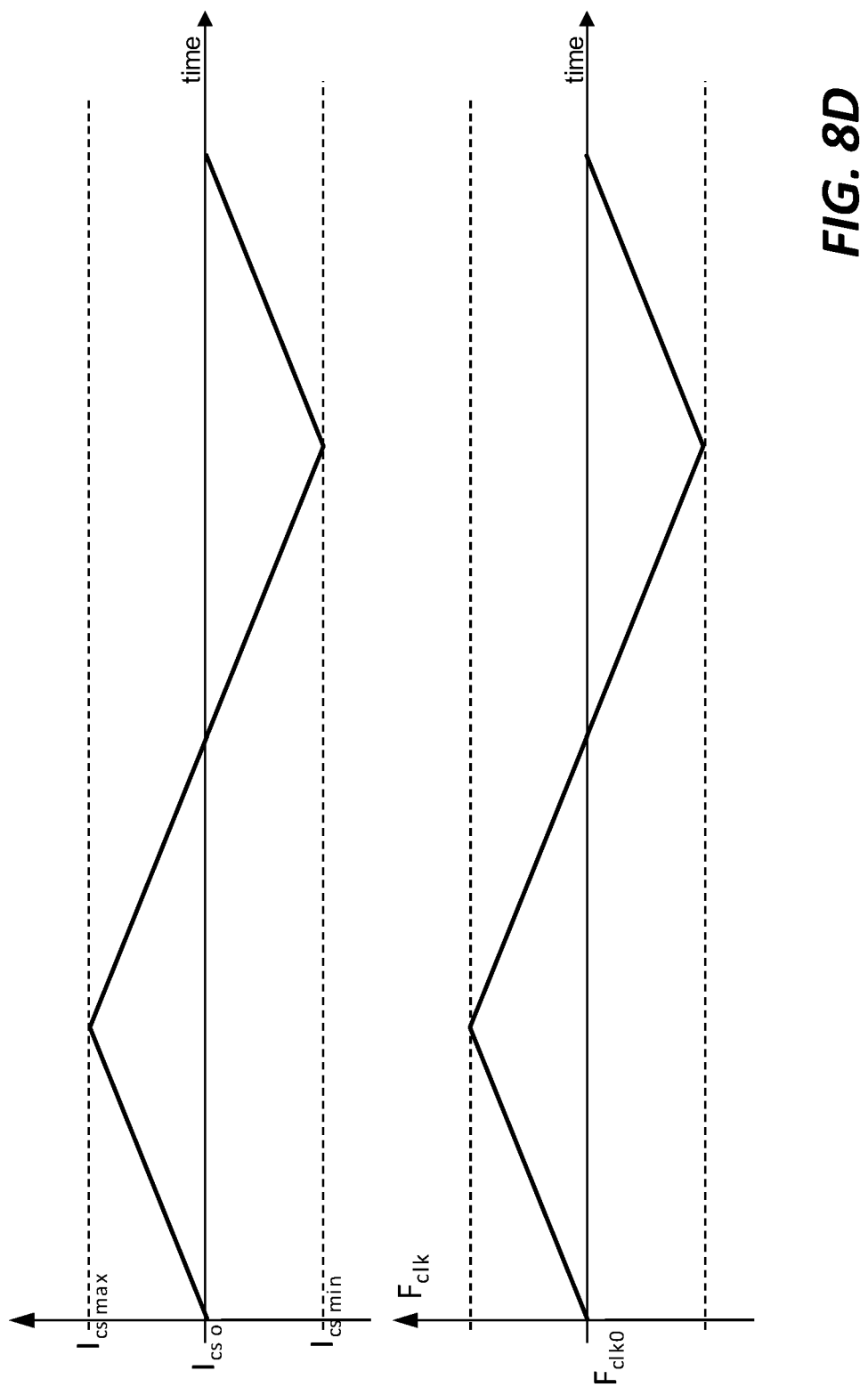
FIG. 8D is a diagram illustrating the relationship between input current to an oscillator and the frequency of the clock signal output by the oscillator over time, according to some embodiments of the present disclosure.

FIG. 8C illustrates an oscillator 810 in accordance with some embodiments of the present disclosure. The oscillator 810 may be any appropriate oscillator (such as the RC oscillator 205 illustrated in FIG. 2) whose output clock signal (clk) frequency (Fclk) is based at least in part on the input current (Ics) value. The input current Ics may be any appropriate input current to one or more elements of the oscillator 810 (e.g., an inverter, a PMOS transistor, or other internal node thereof), such as a supply current (e.g., where oscillator 810 is a current controlled oscillator), or any other current which may influence Fclk. The periodic slow variation of Ics may result in a modulation of the Fclk, as shown in FIG. 8D by way of example only.

Figure 9A:
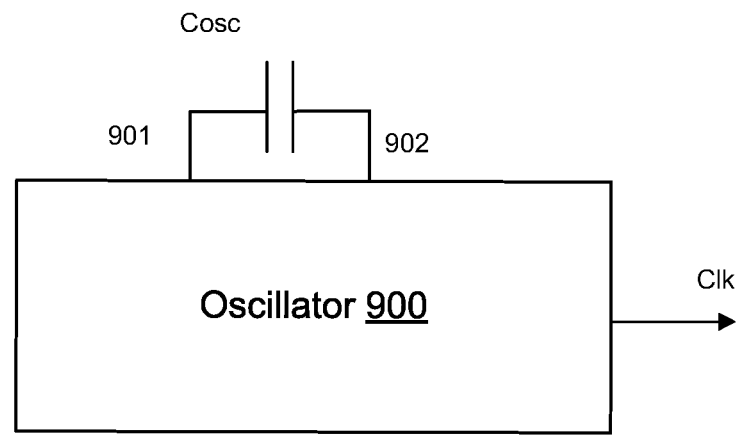
FIG. 9A is a block diagram illustrating an oscillator, according to some embodiments of the present disclosure.
Figure 9B:
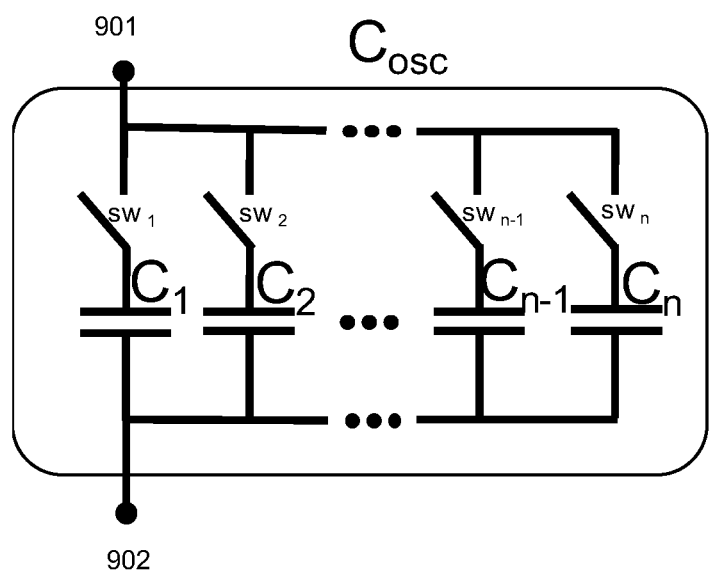
FIG. 9B is a block diagram illustrating a capacitance circuit for modulating the frequency of the clock signal output by the oscillator of FIG. 9A, according to some embodiments of the present disclosure.

FIG. 9A illustrates an oscillator 900 in accordance with some embodiments of the present disclosure. The oscillator 900 may include capacitance circuit Cosc which is connected between nodes 901 and 902. The node 902 may correspond to ground, a supply voltage, or any other appropriate reference point. In some embodiments, oscillator 900 may be an RC oscillator (such as RC oscillator 205 illustrated in FIG. 2) and the capacitance circuit Cosc (which may be similar to capacitance Cosc illustrated in FIG. 2 in some embodiments) may provide the capacitance for the RC oscillator. In other embodiments, the capacitance circuit Cosc may be an additional capacitance on top of an existing capacitance mechanism that is providing the capacitance for the RC oscillator. Oscillator 900 may be any appropriate oscillator whose output clock signal (clk) frequency (Fclk)

is based at least in part on variations in Cosc. Stated differently, Fclk may be modulated by varying the capacitance of Cosc. As shown in FIG. 9B, the circuit Cosc may include capacitors $C_1$-$C_n$, which are each connected to node 901 through respective switches $SW_1$-$SW_n$. The control signal waveforms of the switches SW over time are shown in the diagram of FIG. 9C, while FIG. 9D illustrates a diagram of Fclk over time.

Figure 9C:
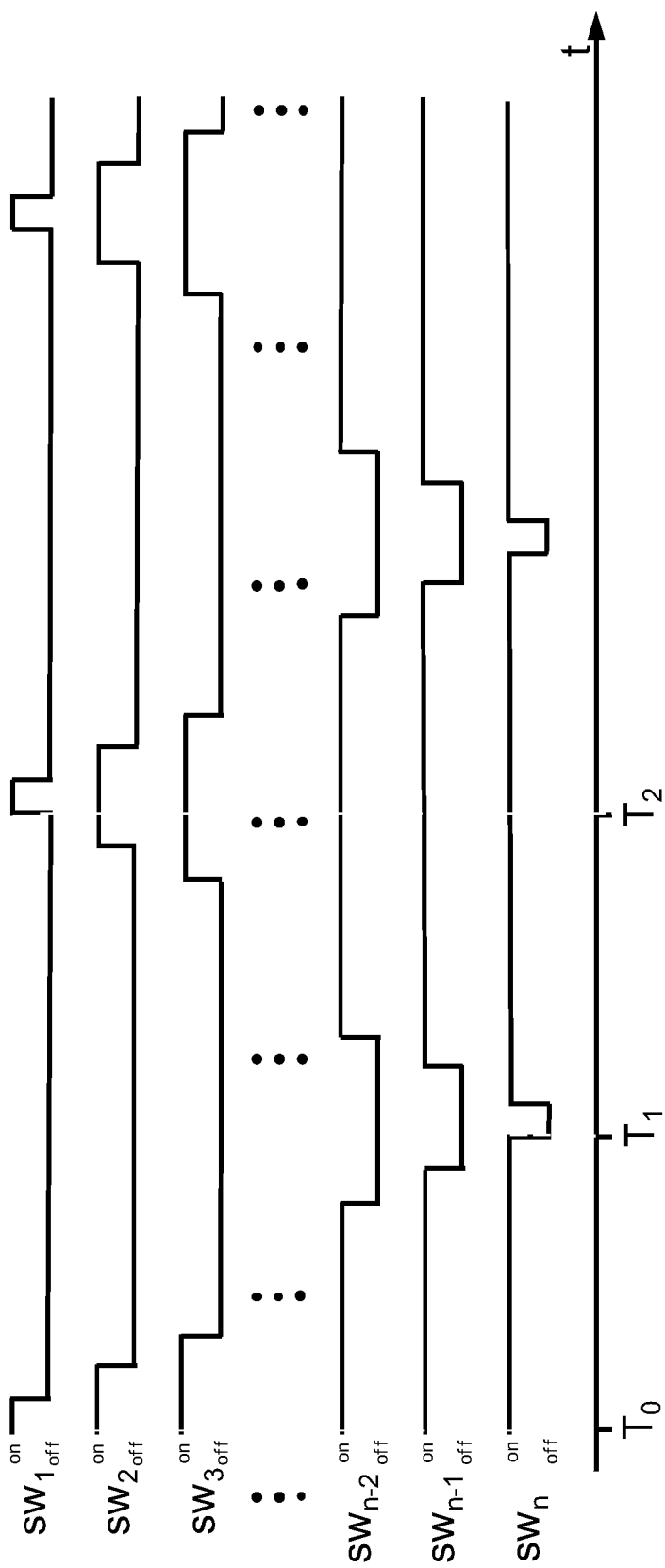
FIG. 9C is a diagram illustrating control signal waveforms of switches in the capacitance circuit of FIG. 9B over time, according to some embodiments of the present disclosure.
Figure 9D:
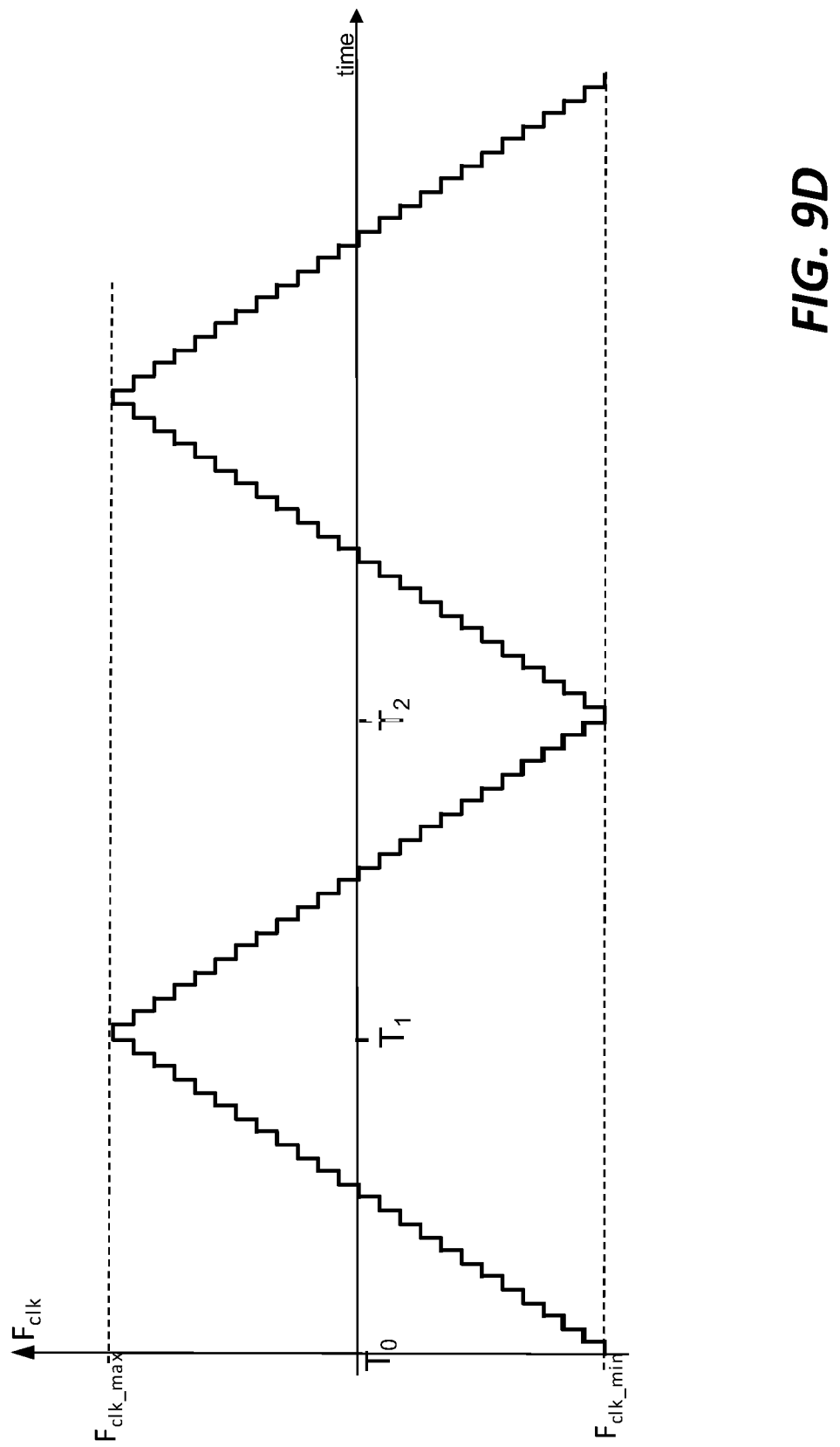
FIG. 9D is a diagram illustrating the frequency of the clock signal output by the oscillator of FIG. 9A over time, according to some embodiments of the present disclosure.

Referring to both FIGS. 9C and 9D as well, when all capacitors C are connected to node 901 (at time $T_0$), the total capacitance of the circuit Cosc is maximized and thus the oscillator frequency Fclk is at its minimum value ($F_{clk\_min}$). As the capacitors $C_1$-Cn are gradually disconnected (e.g., one-by-one) from node 901, the total capacitance of the circuit Cosc is reduced to its minimum value and as result, the Fclk gradually increases to its maximal value ($F_{clk\_max}$) at time $T_1$. As can be seen, the more capacitors C that the capacitance circuit Cosc includes, the more granular the frequency modulation may become. Stated differently, the more capacitors C that the capacitance circuit Cosc includes, the smaller the resulting change in Fclk for each decoupled capacitor, such that with enough capacitors the change in Fclk over time will be smooth and appear analog. The capacitors $C_1$-Cn may be disconnected one-by-one at a slow rate, thereby resulting in the modulation of Fclk over a wider range of frequencies as shown in FIG. 9D. The switches SW of the capacitance circuit Cosc may be operated by MCU 1210 illustrated in FIG. 12, for example.

Figure 10A:
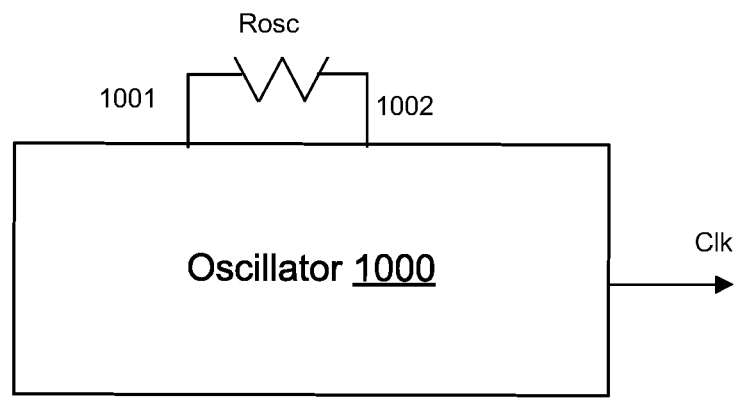
FIG. 10A is a block diagram illustrating an oscillator, according to some embodiments of the present disclosure.
Figure 10B:
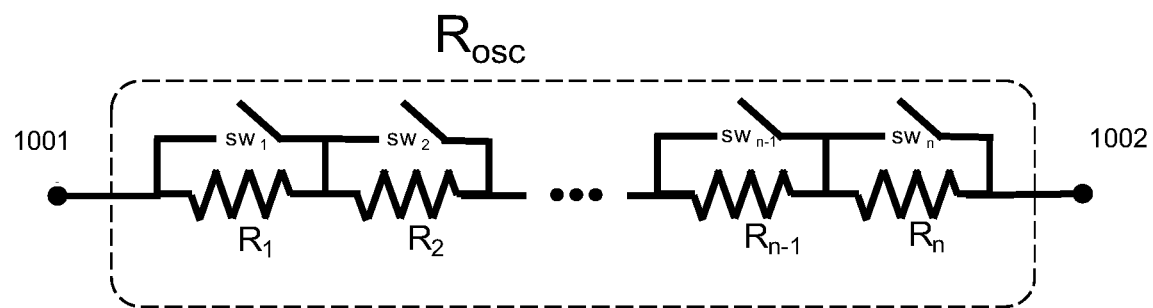
FIG. 10B is a block diagram illustrating a resistance circuit for modulating the frequency of the clock signal output by the oscillator of FIG. 10A, according to some embodiments of the present disclosure.

FIG. 10A illustrates an oscillator 1000 in accordance with some embodiments of the present disclosure. The oscillator 1000 may include resistance circuit Rosc which is connected between nodes 1001 and 1002. The node 1002 may correspond to ground, a supply voltage, or any other appropriate reference point. In some embodiments, oscillator 1000 may be an RC oscillator (such as RC oscillator 205 illustrated in FIG. 2) and the resistance circuit Cosc (which may be similar to resistance Rosc illustrated in FIG. 2 in some embodiments) may provide the resistance for the RC oscillator. In other embodiments, the resistance circuit Rosc may be an additional resistance on top of an existing resistance mechanism that is providing the resistance for the RC oscillator. The oscillator 1000 may be any appropriate oscillator whose output clock signal (clk) frequency (Fclk) is based at least in part on variations in Rosc. Stated differently, Fclk may be modulated by varying the resistance of the circuit Rosc. As shown in FIG. 10B, the circuit Rosc may include serially connected resistors $R_1$-Rn, which are each connected to node 1001 through respective switches $SW_1$-SWn. The control signal waveforms of the switches SW over time may be similar to those shown in the diagram of FIG. 9C, while FIG. 10C illustrates a diagram of Fclk over time.

Referring to FIG. 10C as well, when all resistors R are connected to node 1001 (at time $T_0$), the total resistance of the circuit Rosc is at a minimal value, and thus the oscillator frequency Fclk is at a maximum value ($F_{clk\_max}$). As the resistors $R_1$-Rn are gradually disconnected (e.g., one-by-one) from node 1001, the total resistance of the circuit Rosc increases to its maximum value and as result, the Fclk gradually decreases to its minimal value ($F_{clk\_min}$) at time $T_1$. As can be seen, the more resistors R that the resistance circuit Rosc includes, the more granular the frequency modulation may become. Stated differently, the more resistors R that the resistance circuit Rosc includes, the smaller the resulting change in Fclk for each decoupled resistor, such that with enough resistors the change in Fclk over time will be smooth and appear analog. The resistors $R_1$-Rn may be disconnected one-by-one at a slow rate, thereby resulting in the modulation of Fclk over a wider range of frequencies as shown in FIG. 10C. It should be noted that the embodiments described in FIGS. 8A-10C are not mutually exclusive, and may be used in combination with each other as well as in combination with other embodiments described herein. The resistance circuit Rosc may be operated by MCU 1210 illustrated in FIG. 12, for example. It should also be noted that in order to effectively reduce EMI in the embodiments described in FIGS. 8A-10C, the frequency of change of the Cosc total capacitance should be significantly less than Fclk.

Figure 11:
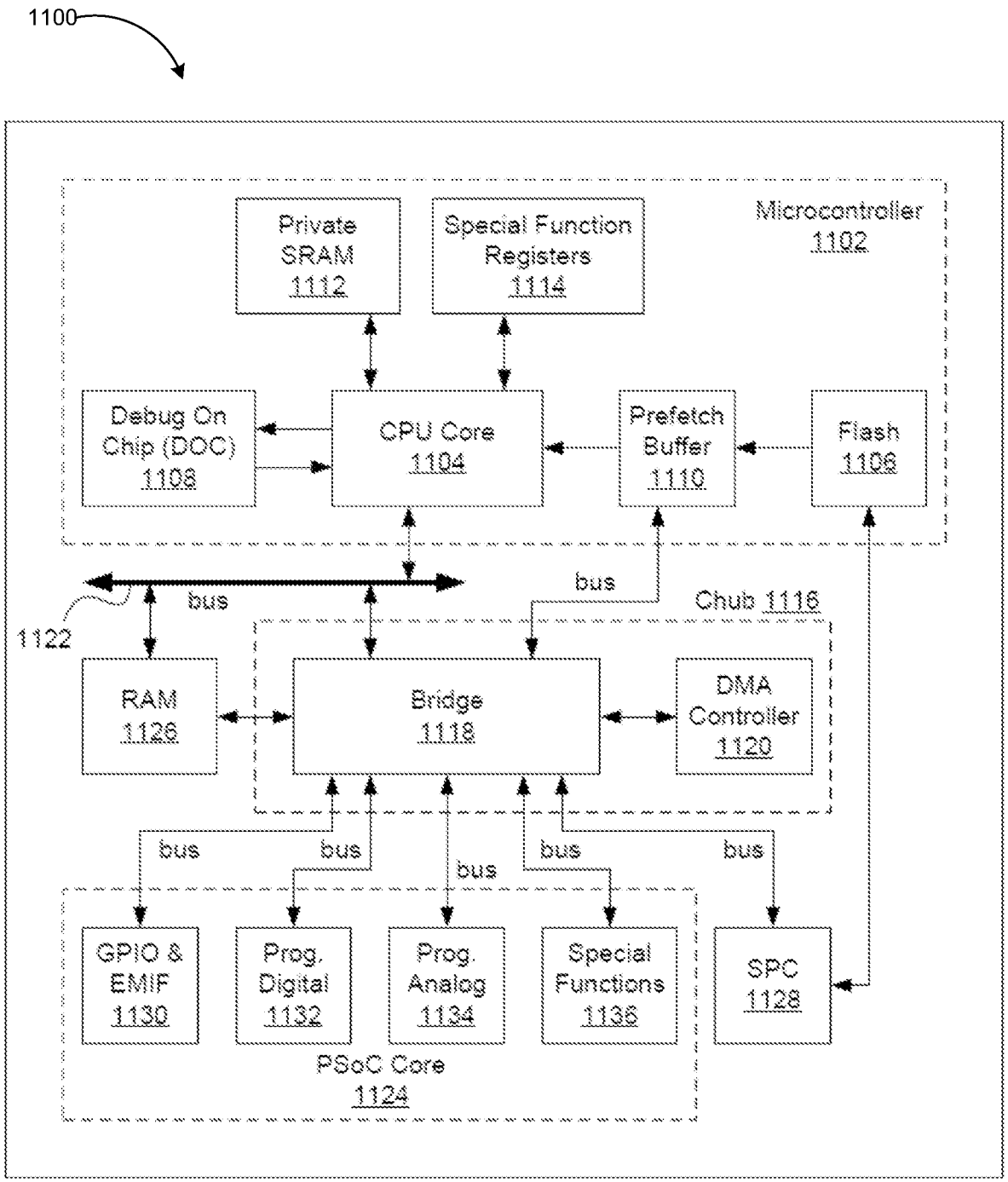
FIG. 11 illustrates an embodiment of a core architecture of a Programmable System-on-Chip (PSoC®) micro-controller.

FIG. 11 illustrates an embodiment of a core architecture 1100 of a controller such as the Traveo® or PSoC® controllers offered by Cypress Semiconductor Corporation (San Jose, Calif.), in which embodiments of the present disclosure may be realized. In one embodiment, the core architecture 1100 includes a microcontroller 1102. The microcontroller 1102 includes a CPU (central processing unit) core 1104, flash program storage 1106, DOC (debug on chip) 1108, a prefetch buffer 1110, a private SRAM (static random access memory) 1112, and special functions registers 1114. In an embodiment, the DOC 1108, prefetch buffer 1110, private SRAM 1112, and special function registers 1114 are coupled to the CPU core 1104 (e.g., CPU core 1006), while the flash storage 1106 is coupled to the prefetch buffer 1110. The flash storage 1106 may be a memory chip in which embodiments of the present disclosure may be realized (as discussed herein and with respect to FIG. 9).

The core architecture 1100 may also include a CHub (core hub) 1116, including a bridge 1118 and a DMA controller 1120 that is coupled to the microcontroller 1102 via bus 1122. The CHub 1116 may provide the primary data and control interface between the microcontroller 1102 and its peripherals (e.g., peripherals) and memory, and a programmable core 1124. The DMA controller 1120 may be programmed to transfer data between system elements without burdening the CPU core 1104. In various embodiments, each of these subcomponents of the microcontroller 1102 and CHub 1116 may be different with each choice or type of CPU core 1104. The CHub 1116 may also be coupled to shared SRAM 1126 and an SPC (system performance controller) 1128. The private SRAM 1112 is independent of the shared SRAM 1126 that is accessed by the microcontroller 1102 through the bridge 1118. The CPU core 1104 accesses the private SRAM 1112 without going through the bridge 1118, thus allowing local register and RAM accesses to occur simultaneously with DMA access to shared SRAM 1126. Although labeled here as SRAM, these memory modules may be any suitable type of a wide variety of (volatile or non-volatile) memory or data storage modules in various other embodiments.

In various embodiments, the programmable core 1124 may include various combinations of subcomponents (not shown), including, but not limited to, a digital logic array, digital peripherals, analog processing channels, global routing analog peripherals, DMA controller(s), SRAM and other appropriate types of data storage, IO ports, and other suitable types of subcomponents. In one embodiment, the programmable core 1124 includes a GPIO (general purpose IO) and EMIF (extended memory interface) block 1130 to provide a mechanism to extend the external off-chip access of the microcontroller 1102, a programmable digital block 1132, a programmable analog block 1134, and a special functions block 1136, each configured to implement one or more of the subcomponent functions. In various embodiments, the special functions block 1136 may include dedicated (non-programmable) functional blocks and/or include one or more interfaces to dedicated functional blocks, such as USB, a crystal oscillator drive, JTAG, and the like.

The programmable digital block 1132 may include a digital logic array including an array of digital logic blocks and associated routing. In one embodiment, the digital block architecture is comprised of UDBs (universal digital blocks). For example, each UDB may include an ALU together with CPLD functionality.

In various embodiments, one or more UDBs of the programmable digital block 1132 may be configured to perform various digital functions, including, but not limited to, one or more of the following functions: a basic I2C slave; an I2C master; a SPI master or slave; a multi-wire (e.g., 3-wire) SPI master or slave (e.g., MISO/MOSI multiplexed on a single pin); timers and counters (e.g., a pair of 8-bit timers or counters, one 16 bit timer or counter, one 8-bit capture timer, or the like); PWMs (e.g., a pair of 8-bit PWMs, one 16-bit PWM, one 8-bit deadband PWM, or the like), a level sensitive I/O interrupt generator; a quadrature encoder, a UART (e.g., half-duplex); delay lines; and any other suitable type of digital function or combination of digital functions which can be implemented in a plurality of UDBs.

In other embodiments, additional functions may be implemented using a group of two or more UDBs. Merely for purposes of illustration and not limitation, the following functions can be implemented using multiple UDBs: an I2C slave that supports hardware address detection and the ability to handle a complete transaction without CPU core (e.g., CPU core 1104) intervention and to help prevent the force clock stretching on any bit in the data stream; an I2C multi-master which may include a slave option in a single block; an arbitrary length PRS or CRC (up to 32 bits); SDIO; SGPIO; a digital correlator (e.g., having up to 32 bits with 4× over-sampling and supporting a configurable threshold); a delta-sigma modulator (e.g., for class D audio DAC having a differential output pair); an I2S (stereo); an LCD drive control (e.g., UDBs may be used to implement timing control of the LCD drive blocks and provide display RAM addressing); full-duplex UART (e.g., 7-, 8- or 9-bit with 1 or 2 stop bits and parity, and RTS/CTS support), an IRDA (transmit or receive); capture timer (e.g., 16-bit or the like); deadband PWM (e.g., 16-bit or the like); an SMbus (including formatting of SMbus packets with CRC in software); a brushless motor drive (e.g., to support 6/12 step commutation); auto BAUD rate detection and generation (e.g., automatically determine BAUD rate for standard rates from 1200 to 115200 BAUD and after detection to generate required clock to generate BAUD rate); and any other suitable type of digital function or combination of digital functions which can be implemented in a plurality of UDBs.

The programmable analog block 1134 may include analog resources including, but not limited to, comparators, mixers, PGAs (programmable gain amplifiers), TIAs (trans-impedance amplifiers), ADCs (analog-to-digital converters), DACs (digital-to-analog converters), voltage references, current sources, sample and hold circuits, and any other suitable type of analog resources. The programmable analog block 1134 may be used to realize the embodiments described herein as well as support various other analog functions including, but not limited to, analog routing, LCD drive IO support, capacitance-sensing, voltage measurement, motor control, current to voltage conversion, voltage to frequency conversion, differential amplification, light measurement, inductive position monitoring, filtering, voice coil driving, magnetic card reading, acoustic doppler measurement, echo-ranging, modem transmission and receive encoding, or any other suitable type of analog function.

Figure 12:
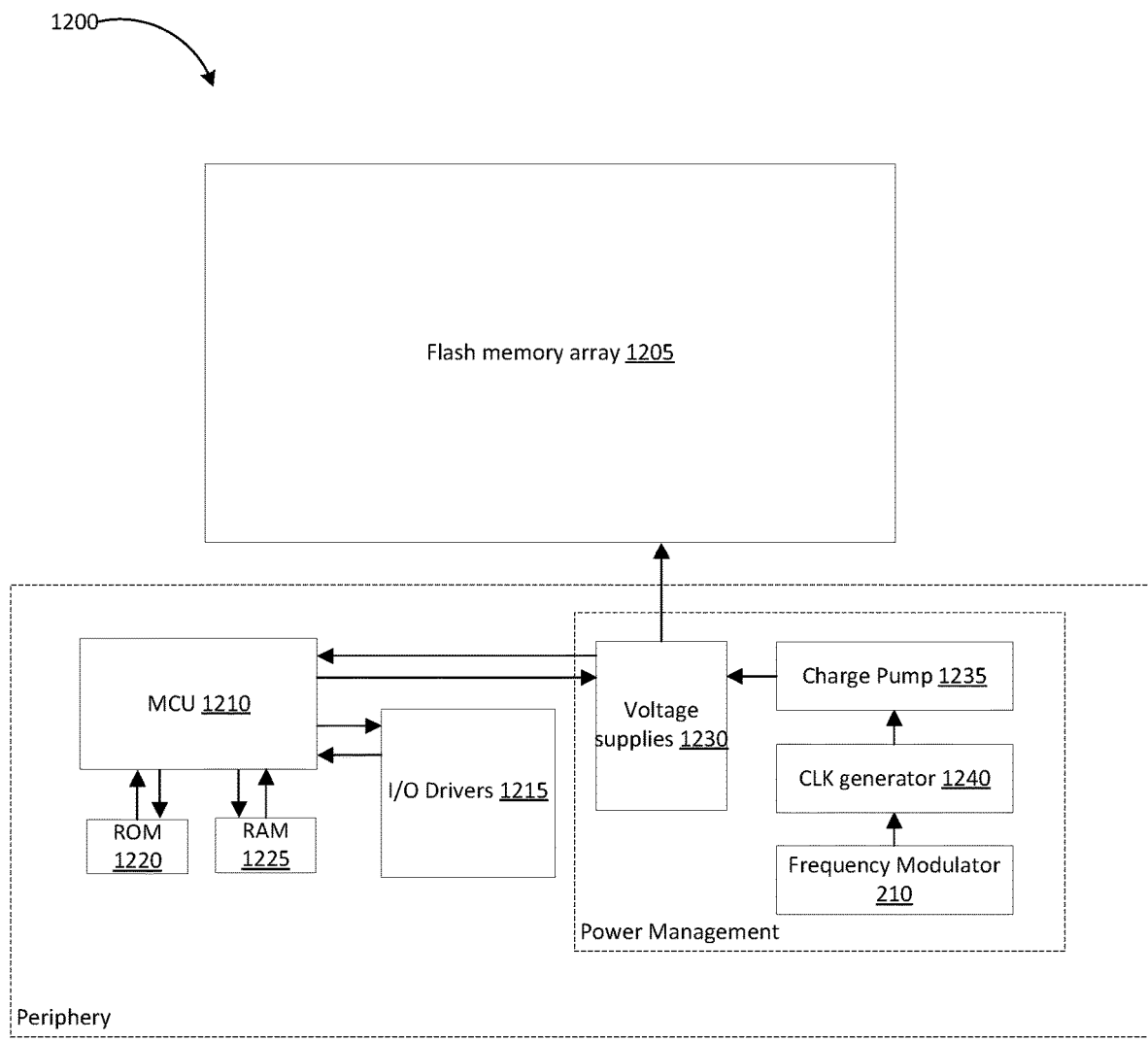
FIG. 12 is a block diagram of an architecture of a flash memory chip, in accordance with some embodiments of the present disclosure.

FIG. 12 illustrates a flash memory chip 1200 in which embodiments of the present disclosure may be implemented. Memory chip 1200 may include a flash memory array 1205 which may comprise a plurality of memory cells and decoders. A charge pump 1235 may generate a driver charge into the voltage supply 1230 at every edge of a clock signal provided by clock generator 1240. The voltage supply 1230 may provide a power supply voltage to the memory array 1205. The clock generator 1240 may be similar to the oscillator 205 discussed above with respect to FIGS. 2-3B. The memory chip 1200 may include input/output drivers 1215 which may function to receive read/write requests etc. Micro-controller unit 1210 (hereinafter referred to as MCU 1210) may control the functionality of the other components of the memory chip 1200, such as enabling the charge pump 1235 and managing read/write requests (e.g., putting addresses on the memory array 1205) etc. Frequency modulator 210 may operate to modulate the frequency of the clock signal provided by the clock generator 1240 of charge pump 1235 as discussed herein, thereby spreading noise generated by the charge pump 1235 over a wider range of clock frequencies as discussed in further detail herein.

In the above description, numerous details are set forth. It will be apparent, however, to one of ordinary skill in the art having the benefit of this disclosure, that embodiments of the present disclosure may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "determining," "detecting," "comparing," "resetting," "adding," "calculating," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance, or illustration. Any aspect or design described herein as "example' or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such.

Embodiments descried herein may also relate to an apparatus for performing the operations herein. This apparatus may be specially constructed for the required purposes, or it may comprise a general-purpose computer selectively activated or reconfigured by a computer program stored in the computer. Such a computer program may be stored in a non-transitory computer-readable storage medium, such as, but not limited to, any type of disk including floppy disks, optical disks, CD-ROMs and magnetic-optical disks, read-only memories (ROMs), random access memories (RAMs), EPROMs, EEPROMs, magnetic or optical cards, flash memory, or any type of media suitable for storing electronic instructions. The term "computer-readable storage medium" should be taken to include a single medium or multiple media (e.g., a centralized or distributed database and/or associated caches and servers) that store one or more sets of instructions. The term "computer-readable medium" shall also be taken to include any medium that is capable of storing, encoding, or carrying a set of instructions for execution by the machine and that causes the machine to perform any one or more of the methodologies of the present embodiments. The term "computer-readable storage medium" shall accordingly be taken to include, but not be limited to, solid-state memories, optical media, magnetic media, any medium that is capable of storing a set of instructions for execution by the machine and that causes the machine to perform any one or more of the methodologies of the present embodiments.

The algorithms and displays presented herein are not inherently related to any particular computer or other apparatus. Various general-purpose systems may be used with programs in accordance with the teachings herein, or it may prove convenient to construct a more specialized apparatus to perform the required method steps. The required structure for a variety of these systems will appear from the description below. In addition, the present embodiments are not described with reference to any particular programming language. It will be appreciated that a variety of programming languages may be used to implement the teachings of the embodiments as described herein.

The above description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present embodiments. Thus, the specific details set forth above are merely exemplary. Particular implementations may vary from these exemplary details and still be contemplated to be within the scope of the present embodiments.

It is to be understood that the above description is intended to be illustrative and not restrictive. Many other embodiments will be apparent to those of skill in the art upon reading and understanding the above description. The scope of the embodiments should, therefore, be determined with reference to the appended claims, along with the full scope of equivalents to which such claims are entitled.

What is claimed is:

1. A system comprising:
    an oscillator configured to generate a clock signal; and
    a frequency modulator operatively coupled to the oscillator, the frequency modulator configured to:
    alternately provide a charge current and a discharge current to a node of the oscillator during charging and discharging stages of the node based on a modulator clock signal and when the modulator clock signal is in phase with the clock signal to increase a frequency of the clock signal, wherein the modulator clock signal has a first frequency; and
    alternately provide the charge current and the discharge current to the node of the oscillator during charging and discharging stages of the node based on the modulator clock signal and when the modulator clock signal is not in phase with the clock signal to decrease the frequency of the clock signal, thereby varying the frequency of the clock signal around a nominal frequency based on the modulator clock signal.

2. The system of claim 1, wherein the frequency modulator is further configured to:
    generate the charge current at a first transistor and generate the discharge current at a second transistor by alternately charging and discharging a reference node of the frequency modulator at a second frequency that is lower than the first frequency, wherein the frequency modulator comprises a switching circuit configured to alternately charge and discharge the reference node.

3. The system of claim 2, wherein the frequency modulator is further configured to:
    receive the clock signal from the oscillator;
    generate, based on the clock signal, a first clock signal having the second frequency and a second clock signal using a frequency divider, the first clock signal to control operation of the switching circuit;
    generate, using an exclusive OR (XOR) device, the modulator clock signal based on the second clock signal and the clock signal, wherein the second clock signal has a lower frequency than the first clock signal and the modulator clock signal is alternately in-phase with and out of phase with the clock signal based on the second clock signal.

4. The system of claim 2, wherein the frequency modulator comprises:
    a first switching transistor configured to provide the charge current from the first transistor to the node of the oscillator based on the modulator clock signal; and
    a second switching transistor configured to provide the discharge current from the second transistor to the node of the oscillator based on the modulator clock signal.

5. The system of claim 2, wherein the frequency modulator utilizes the switching circuit and a switch capacitor to alternately charge and discharge the reference node.

6. The system of claim 2, wherein the frequency modulator utilizes the switching circuit and an equivalent resistance of a switch capacitor to alternately charge and discharge the reference node.

7. The system of claim 3, wherein the frequency of the second clock signal is half the frequency of the first clock signal.

8. An apparatus comprising:
a reference node;
a switching circuit configured to alternately charge and discharge the reference node to generate a charge current and a discharge current, wherein the charge current and the discharge current vary with time; and
a driver circuit configured to:
alternately provide the charge current and the discharge current to a node of an oscillator during charging and discharging stages of the node based on a modulator clock signal and when the modulator clock signal is in phase with a clock signal generated by the oscillator to increase a frequency of the clock signal, wherein the modulator clock signal has a first frequency; and
alternately provide the charge current and the discharge current to the node of the oscillator during charging and discharging stages of the node based on the modulator clock signal and when the modulator clock signal is not in phase with the clock signal to decrease the frequency of the clock signal, thereby varying the frequency of the clock signal around a nominal frequency based on the modulator clock signal.

9. The apparatus of claim 8, wherein the driver circuit comprises a first transistor and a second transistor, and wherein the switching circuit is configured to generate the charge current at the first transistor and generate the discharge current at the second transistor by alternately charging and discharging the reference node at a second frequency that is lower than the first frequency.

10. The apparatus of claim 9, further comprising:
a frequency divider configured to generate, based on the clock signal, a first clock signal having the second frequency and a second clock signal, the first clock signal to control operation of the switching circuit; and
an exclusive OR (XOR) device configured to generate the modulator clock signal based on the second clock signal and the clock signal, wherein the second clock signal has a lower frequency than the first clock signal and the modulator clock signal is alternately in-phase with and out of phase with the clock signal based on the second clock signal.

11. The apparatus of claim 9, wherein the driver circuit further comprises:
a first switching transistor configured to provide the charge current from the first transistor to the node of the oscillator based on the modulator clock signal; and
a second switching transistor configured to provide the discharge current from the second transistor to the node of the oscillator based on the modulator clock signal.

12. The apparatus of claim 9, further comprising:
a switch capacitor wherein the switching circuit utilizes the switch capacitor to alternately charge and discharge the reference node.

13. The apparatus of claim 9, further comprising:
an equivalent resistance of a switch capacitor, wherein the switching circuit utilizes the equivalent resistance to alternately charge and discharge the reference node.

14. The apparatus of claim 10, wherein the frequency of the second clock signal is half the frequency of the first clock signal.

15. A method comprising:
alternately charging and discharging a reference node to generate a charge current and a discharge current, wherein the charge current and the discharge current vary with time;
alternately providing the charge current and the discharge current to a node of an oscillator during charging and discharging stages of the node based on a modulator clock signal and when the modulator clock signal is in phase with a clock signal generated by the oscillator to increase a frequency of the clock signal, wherein the modulator clock signal has a first frequency; and
alternately providing the charge current and the discharge current to the node of the oscillator during charging and discharging stages of the node based on the modulator clock signal and when the modulator clock signal is not in phase with the clock signal to decrease the frequency of the clock signal, thereby varying the frequency of the clock signal around a nominal frequency based on the modulator clock signal.

16. The method of claim 15, wherein the charge current is generated at a first transistor and the discharge current is generated at a second transistor by a switching circuit, the switching circuit alternately charging and discharging the reference node at a second frequency that is lower than the first frequency.

17. The method of claim 16, further comprising:
generating, using a frequency divider, a first clock signal having the second frequency and a second clock signal using a frequency divider, the first clock signal to control operation of the switching circuit; and
generating, using an exclusive OR (XOR) device, the modulator clock signal based on the second clock signal and the clock signal, wherein the second clock signal has a lower frequency than the first clock signal and the modulator clock signal is alternately in-phase with and out of phase with the clock signal based on the second clock signal.

18. The method of claim 16, wherein the charge current is provided from the first transistor to the node of the oscillator using a first switching transistor and based on the modulator clock signal; and
the discharge current is provided from the second transistor to the node of the oscillator using a second switching transistor and based on the modulator clock signal.

19. The method of claim 16, wherein the switching circuit utilizes a switch capacitor to alternately charge and discharge the reference node.

20. The method of claim 16, wherein the switching circuit utilizes an equivalent resistance of a switch capacitor to alternately charge and discharge the reference node.

21. The method of claim 15, further comprising:
varying one or more of an input voltage and an input current to the oscillator to further vary the frequency of the clock signal around the nominal frequency.

22. The method of claim 15, further comprising:
varying one or more of a resistance and a capacitance of the oscillator to further vary the frequency of the clock signal around the nominal frequency.

23. The method of claim 22, wherein the resistance of the oscillator is provided by a resistance circuit comprising a plurality of resistors coupled to the oscillator, and wherein varying the resistance of the oscillator comprises:

alternately:
uncoupling each of the plurality resistors from the oscillator; and
recoupling each of the plurality of resistors to the oscillator.

24. The method of claim 22, wherein the capacitance of the oscillator is provided by a capacitance circuit comprising a plurality of capacitors coupled to the oscillator, and wherein varying the capacitance of the oscillator comprises:
alternately:
uncoupling each of the plurality capacitors from the oscillator; and
recoupling each of the plurality of capacitors to the oscillator.

\* \* \* \* \*